(12) United States Patent
Fujimori et al.

(10) Patent No.: US 7,521,158 B2
(45) Date of Patent: Apr. 21, 2009

(54) NEGATIVE DYE-CONTAINING CURABLE COMPOSITION, COLOR FILTER AND METHOD OF PRODUCING THE SAME

(75) Inventors: Toru Fujimori, Shizuoka (JP); Yuki Mizukawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 770 days.

(21) Appl. No.: 11/218,616

(22) Filed: Sep. 6, 2005

(65) Prior Publication Data

US 2006/0051685 A1 Mar. 9, 2006

(30) Foreign Application Priority Data

Sep. 3, 2004 (JP) ............................. 2004-257481

(51) Int. Cl.
*G02B 5/20* (2006.01)
(52) U.S. Cl. ....................................... 430/7; 430/270.1
(58) Field of Classification Search ..................... None
See application file for complete search history.

(56) References Cited

U.S. PATENT DOCUMENTS

| 2002/0045111 | A1* | 4/2002 | Machiguchi et al. ............ 430/7 |
| 2004/0102548 | A1* | 5/2004 | Suzuki ......................... 524/88 |

FOREIGN PATENT DOCUMENTS

| JP | 2-181704  | A |   | 7/1990  |
| JP | 2-199403  | A |   | 8/1990  |
| JP | 5-273411  | A |   | 10/1993 |
| JP | 6-75375   | A |   | 3/1994  |
| JP | 7-013014  | A | * | 1/1995  |
| JP | 7-140654  | A |   | 6/1995  |

OTHER PUBLICATIONS

Computer-generated translation of JP 7-013014 (Jan. 1995).*

* cited by examiner

*Primary Examiner*—John A. McPherson
(74) *Attorney, Agent, or Firm*—Sughrue Mion, PLLC

(57) ABSTRACT

The present invention provides a negative dye-containing curable composition comprising at least (A) an alkali-soluble binder, (B) an organic solvent-soluble dye, (C) a photopolymerization initiator, (D) a radical-polymerizable monomer and (E) an organic solvent, wherein the organic solvent-soluble dye (B) comprises at least one kind of azomethine-type dye represented by the following formula (I) and at least one kind of tetraazaporphyrin-type dye represented by the following formula (A), and the photopolymerization initiator (C) is an oxime-type compound, Formula (I)

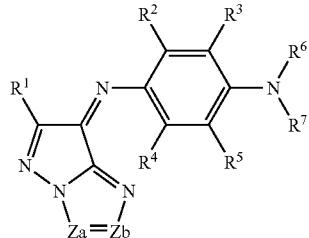

Formula (A)

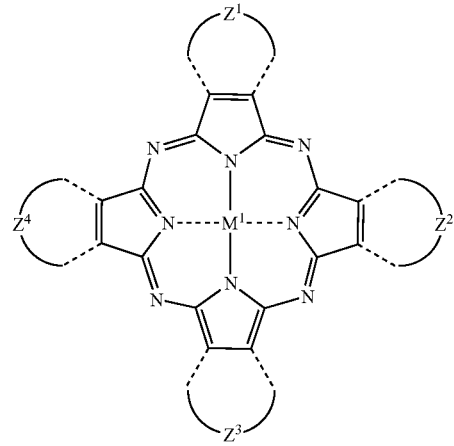

wherein $R^1$ represents a hydrogen atom or a substituent group; $R^2$ to $R^5$ each represent a hydrogen atom or a substituent group, $R^6$ to $R^7$ each represent an alkyl group, alkenyl group, aryl group or heterocyclic group, Za and Zb each represent —N= or —C($R^8$)=; $R^8$ represents a hydrogen atom, alkyl group, aryl group or heterocyclic group; $M^1$ represents a metal, and $Z^1$ to $Z^4$ each represent an atomic group forming a 6-membered ring composed of atoms selected from carbon and nitrogen.

19 Claims, No Drawings

NEGATIVE DYE-CONTAINING CURABLE COMPOSITION, COLOR FILTER AND METHOD OF PRODUCING THE SAME

CROSS-REFERENCE TO RELATED APPLICATION

This application claims priority under 35USC 119 from Japanese Patent Application No. 2004-257481, the disclosure of which is incorporated by reference herein.

BACKGROUND OF THE INVENTION

1. Field of the Invention

The present invention relates to a negative dye-containing curable composition suitable for forming colored images constituting color filters used for liquid crystal display elements (CVD), solid state image pickup elements (for example, CCD and CMOS) and the like, also to a color filter produced by using the negative dye-containing curable composition and, further, to a method of producing the color filter.

2. Description of the Related Art

As methods of producing a color filter used for liquid crystal display elements and solid state image pick-up elements, a dyeing method, a printing method, an electrodepositing method and a pigment dispersion method are known.

In the pigment dispersion method, the color filter is produced by a photolithographic method using a colored radiation-sensitive composition prepared by dispersing a pigment in any one of various types of photosensitive compositions. The color filter produced by this method is stable with respect to light, heat and the like since the pigment is used. A high positional accuracy can be obtained in this method since patterning is performed by the photolithographic method and, accordingly, this method has widely been used as a method suitable for producing the color filter for a large screen and high fineness color display.

In a case in which the color filter is produced by the pigment dispersion method, the radiation-sensitive composition is first coated onto a glass substrate by using, for example, a spin coater or a roll coater and, then, dried, to thereby form a coating film. Then, colored pixels are obtained by pattern-exposing and developing the thus-formed coating film. The color filter can be obtained by repeating such operation as described above by the number of different colors.

As for the pigment dispersion method, a method which uses a negative photosensitive composition comprising an alkali-soluble resin together with a photopolymerizable monomer and a photopolymerization initiator is proposed in each of, for example, Japanese Patent Application Laid-Open (JP-A) Nos. 2-181704, 2-199403, 5-273411 and 7-140654.

On the other hand, the color filter for the solid state image pickup element has been required to be finer in recent years. However, it is difficult to further improve resolution of the color filter according to the conventional pigment dispersion system. This is because the pigment dispersion method is not suitable for an application requiring a fine patterning such as the solid state image pickup element since color unevenness occurs due to coarse pigment particles.

In order to solve the aforementioned problems, a technique using a dye instead of the pigment is proposed in JP-A No. 6-75375. However, a problem arises that a dye-containing curable composition is generally inferior to a pigment-containing curable composition in various types of properties such as light fastness, heat resistance, solubility and coating evenness. Further, in a case in which the dye-containing curable composition is used in forming the color filter for the solid state image pickup element, since a film thickness as thin as 1.5 μm or less is particularly required, it is necessary to incorporate a large amount of dye into the curable composition and such incorporation causes other problems of an insufficient adhesion with the substrate, an insufficient curing and bleaching of the dye in an exposed portion and, then, it becomes extremely difficult to attain a good pattern forming property.

SUMMARY OF THE INVENTION

An object of the present invention is to provide a negative dye-containing curable composition preferable for using a dye, specifically a negative dye-containing curable composition having high sensitivity without residues in a unexposed portion, capable of forming a rectangular fine pattern and excellent in heat fastness and light fastness. Another object of the invention is to provide a method of producing a color filter having high cost performance, particularly a color filter for solid photographing element, wherein an excellent color filter can be produced.

The specific means for solving the problem is as follows.

A first aspect of the invention is to provide a negative dye-containing curable composition comprising at least (A) an alkali-soluble binder, (B) an organic solvent-soluble dye, (C) a photopolymerization initiator, (D) a radical-polymerizable monomer and (E) an organic solvent, wherein the organic solvent-soluble dye (B) comprises at least one kind of azomethine-type dye represented by the following formula (I) and at least one kind of tetraazaporphyrin-type dye represented by the following formula (A), and the photopolymerization initiator (C) is an oxime-type compound, Formula (I)

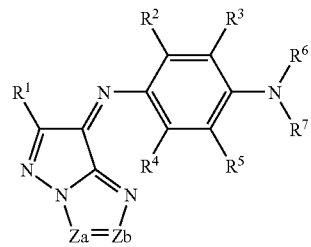

wherein $R^1$ represents a hydrogen atom or a substituent group; $R^2$, $R^3$, $R^4$ and $R^5$ each independently represent a hydrogen atom or a substituent group; $R^6$ and $R^7$ each independently represent an alkyl group, alkenyl group, aryl group or heterocyclic group; Za and Zb each independently represent —N= or —C($R^8$)=; $R^8$ represents a hydrogen atom, allyl group, aryl group or heterocyclic group; and $R^2$ and $R^3$, $R^3$ and $R^6$, $R^4$ and $R^5$, $R^5$ and $R^7$, or $R^6$ and $R^7$ each independently may be bonded to each other to form a 5- to 7-membered ring, Formula (A)

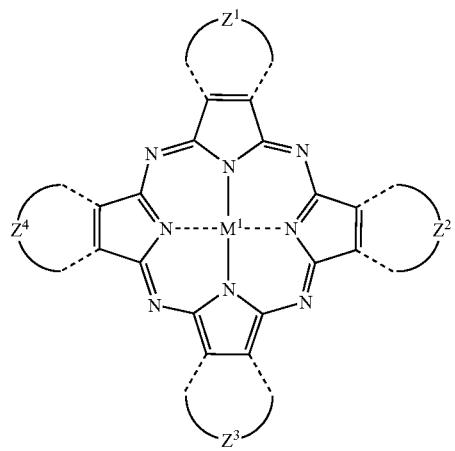

wherein $M^1$ represents a metal, and $Z^1$, $Z^2$, $Z^3$ and $Z^4$ each independently represent an atomic group forming a 6-membered ring composed of atoms selected from a carbon atom and a nitrogen atom.

A second aspect of the invention is to provide a color filter, produced by using a negative dye-containing curable composition comprising at least (A) an alkali-soluble binder, (B) an organic solvent-soluble dye, (C) a photopolymerization initiator, (D) a radical-polymerizable monomer and (E) an organic solvent, wherein the organic solvent-soluble dye (B) comprises at least one kind of azomethine-type dye represented by the following formula (I) and at least one kind of tetraazaporphyrin-type dye represented by the following formula (A), and the photopolymerization initiator (C) is an oxime-type compound,

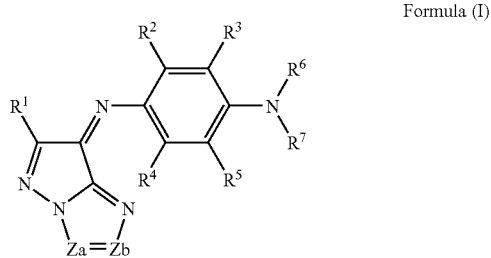

Formula (I)

wherein $R^1$ represents a hydrogen atom or a substituent group; $R^2$, $R^3$, $R^4$ and $R^5$ each independently represent a hydrogen atom or a substituent group; $R^6$ and $R^7$ each independently represent an alkyl group, alkenyl group, aryl group or heterocyclic group; Za and Zb each independently represent —N= or —C($R^8$)=; $R^8$ represents a hydrogen atom, alkyl group, aryl group or heterocyclic group; and $R^2$ and $R^3$, $R^3$ and $R^6$, $R^4$ and $R^5$, $R^5$ and $R^7$, or $R^6$ and $R^7$ each independently may be bonded to each other to form a 5- to 7-membered ring,

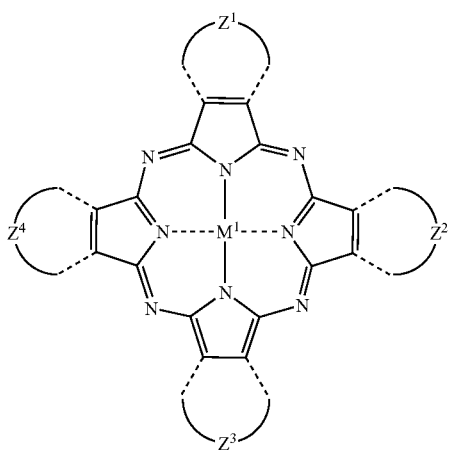

Formula (A)

wherein $M^1$ represents a metal, and $Z^1$, $Z^2$, $Z^3$ and $Z^4$ each independently represent an atomic group forming a 6-membered ring composed of atoms selected from a carbon atom and a nitrogen atom.

A third aspect of the invention is to provide method of producing a color filter, comprising:
applying the negative dye-containing curable composition as set forth in claim 1 on a substrate; exposing the applied negative dye-containing curable composition through a mask; and developing the exposed negative dye-containing curable composition to form a pattern.

DETAILED DESCRIPTION OF THE INVENTION

Hereinafter, a negative dye-containing curable composition of the present invention, a color filter to be producing by using the negative dye-containing curable composition and a method of producing the color filter will be described in detail.

Negative Dye-Containing Curable Composition

The negative dye-containing curable composition of the invention comprises at least (A) an alkali-soluble binder, (B) an organic solvent-soluble dye, (C) a photopolymerization initiator, (D) a radical-polymerizable monomer and (E) an organic solvent, wherein the organic solvent-soluble dye (B) comprises at least one kind of azomethine-type dye represented by the following formula (I) and at least one kind of tetraazaporphyrin-type dye represented by the following formula (A) (hereinafter, these dyes are sometimes referred to collectively as "the dye according to the invention"), and the photopolymerization initiator (C) is an oxime-type compound. The negative dye-containing curable composition of the invention comprises the dye according to the invention thereby being capable of improving heat fastness and light fastness of a pattern formed using the same. Further, the oxime-type compound can be used as a photopolymerization initiator to achieve higher sensitivity, to form a rectangular pattern and to eliminate residues in a unexposed portion.

The exposure of the negative dye-containing curable composition of the invention can be carried out by a proximity method, a mirror projection method, or a stepper method, however the stepper method (a reduction projection exposure method using a reduction projection exposure apparatus) for carrying out the photo-exposure is preferable. Regarding the stepper method, a pattern is formed by exposing whilst changing the exposing amount step-wise. Particularly by carrying out stepper exposure it is possible to realize one of the advantageous effects of the invention, good rectangularity of the pattern contours.

Also, for the exposure apparatus to use in the stepper exposure, for example, an i-line stepper (product name FPA-3000i5+; manufacturer Canon Inc.) and the like can be used.

(A) Alkali-Soluble Binder

Hereinafter, the alkali-soluble binder will be described. The alkali-soluble binder according, to the invention is not particularly restricted, so long as it is soluble in an alkali. However, it is preferable that the alkali-soluble binder is selected from the viewpoint of heat resistance, development ability, availability and the like.

The alkali-soluble binder is preferably a linear organic polymer that is soluble in an organic solvent and developable with a weak alkali aqueous solution. Examples of the linear organic polymer include a polymer having a carboxylic acid on a side chain, such as a methacrylic acid copolymer, an acrylic acid copolymer, an itaconic acid copolymer, a crotonic acid copolymer, a maleic acid copolymer and a partially esterified maleic acid copolymer, described, for example, in JP-A No. 59-44615, JP-B Nos. 54-34327, 58-12577 and 54-25957, and JP-A Nos. 59-53836 and 59-71048, and also, an acidic cellulose derivative having a carboxylic acid on a side chain is useful. In addition to the foregoing, a polymer obtained by adding an acid anhydride to a polymer having a hydroxyl group, a polyhydroxystyrene resin, a polysiloxane resin, poly(2-hydroxyethyl (meth)acrylate), polyvinylpyrrolidone, polyethyleneoxide and polyvinyl alcohol are also useful.

A copolymer copolymerized by monomer having a hydrophilic group may be used as the alkali-soluble binder according to the invention. The examples of the monomer having a hydrophilic group include alkoxyalkyl (meth)acrylate, hydroxyalkyl (meth)acrylate, glycerol (meth)acrylate, (meth)acrylamide, N-methylolacrylamide, secondary or tertiary alkylacrylamide, dialkylaminoalkyl (meth)acrylate, morpholine (meth)acrylate, N-vinylpyrrolidone, N-vinylcaprolactam, vinylimidazole, vinyltriazole, methyl (meth)acrylate, ethyl (meth)acrylate, branched or linear propyl (meth)acrylate, branched or linear butyl (meth)acrylate and phenoxyhydroxypropyl (meth)acrylate.

Furthermore, a monomer having a tetrahydrofurfuryl group, phosphoric acid, a phosphate ester, a quaternary ammonium salt, an ethyleneoxy chain, a propyleneoxy chain, sulfonic acid or a salt thereof, or a morpholinoethyl group is also useful as the monomer having a hydrophilic group.

The alkali-soluble binder according to the invention preferably has an unsaturated double bond in a side chain thereof in order to improve the efficiency of crosslinkage. The unsaturated double bond added to a side chain of the alkali-soluble resin according to the invention includes, for example, an allyl group, (meth)acryl group, vinyl group etc., among which an allyl group and (meth)acryl group are preferable. The unsaturated double bond may be introduced by copolymerizing a unit having the unsaturated double bond or may be introduced later by polymer reaction. As the alkali-soluble binder having such unsaturated double bond in a side chain, KS Resist-106 (manufactured by Osaka Organic Chemical Industry Ltd.), Cyclomer P series (manufactured by Daicel Chemical Industries, Ltd.) etc. are preferably used.

Among the various binders described above, the alkali-soluble binder according to the invention is preferably acrylic resin, and the acrylic resin is preferably a copolymer consisting of monomers selected from benzyl (meth)acrylate, (meth)acrylic acid, hydroxyethyl (meth)acrylate and (meth)acrylamide, or KS Resist-106 (manufactured by Osaka Organic Chemical Industry Ltd.) or Cyclomer P series.

The alkali-soluble binder is preferably a polymer having a weight average molecular weight (a value in terms of polystyrene measured by using a GPC method) in the range of from 1000 to $2 \times 10^5$, more preferably in the range of from 2000 to $1 \times 10^5$ and, particularly preferably, in the range of from 5000 to $5 \times 10^4$ from the viewpoint of the properties of the development and viscosity of the liquid, etc.

The total content of the alkali-soluble binder is preferably in the range of from 10% by mass to 90% by mass based on the total solid components in the composition, more preferably in the range of from 20% by mass to 80% by mass, and still preferably in the range of from 30% by mass to 70, from the viewpoint of improving of the properties of the development etc.

(B) Organic Solvent-soluble Dye

The negative dye-containing curable composition of the invention comprises at least one kind of azomethine-type dye represented by the following formula (I) and at least one kind of tetraazaporphyrin-type dye represented by the following formula (A).

The azomethine-type dye represented by the following formula (I) exhibits an excellent magenta hue with high transmittance, is excellent in stability without deposit with time upon conversion into a liquid preparation or a coating film, and has excellent resistance particularly to heat or light.

Hereinafter, the azomethine-type dye represented by the formula (I) is described based on the description of each group.

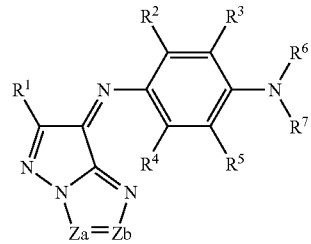

Formula (I)

wherein $R^1$ represents a hydrogen atom or a substituent group.

The substituent group represented by $R^1$ includes a halogen atom (for example, a fluorine atom, chlorine atom, bromine atom), an alkyl group (preferably having 1 to 48 carbon atoms, more preferably having 1 to 18 carbon atoms, linear, branched or cyclic alkyl group such as methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl, 1-adamantyl), an alkenyl group preferably having 2 to 48 carbon atoms, more preferably having 2 to 18 carbon atoms, alkenyl group such as vinyl, allyl, 3-buten-1-yl), an aryl group (preferably a 6 to 48 carbon atoms, more preferably having 6 to 12 carbon atoms, aryl group such as phenyl, naphthyl), a heterocyclic group (preferably a having 1 to 32 carbon atoms, more preferably having 1 to 12 carbon atoms, heterocyclic group such as 2-thienyl, 4-pyridyl, 2-furyl, 2-pyrimidinyl, 1-pyridyl, 2-benzothiazolyl, 1-imidazolyl, 1-pyrazolyl, benzotriazol-1-yl), a silyl group preferably having 3 to 38 carbon atoms, more preferably having 3 to 12 carbon atoms, silyl group such as trimethylsilyl, triethylsilyl, tributylsilyl, t-butyldimethylsilyl, t-hexyldimethylsilyl), a hydroxyl group, a cyano group, a nitro group, an alkoxy group (preferably a having 1 to 48 carbon atoms, more preferably having 1 to 12 carbon atoms, alkoxy group such as methoxy, ethoxy, 1-butoxy, 2-butoxy, isopropoxy, t-butoxy, dodecyloxy, a cycloalkyloxy group (for example, cyclopentyloxy, cyclohexyloxy)), an aryloxy group (for example, having 6 to 48 carbon atoms, more preferably having 6 to 12 carbon atoms, aryloxy group such as phenoxy, 1-naphthoxy), a heterocyclic oxy group (preferably a having 1 to 32 carbon atoms, more preferably having 1 to 12 carbon atoms heterocyclic oxy group such as 1-phenyltetrazol-5-oxy, 2-tetrahydropyranyloxy), a silyloxy group (preferably having 1 to 32 carbon atoms, more preferably having 1 to 12 carbon atoms, silyloxy group such as trimethylsilyloxy, t-butyldimethylsilyloxy, diphenylmethylsilyloxy), an acyloxy group (preferably having 2 to 48 carbon atoms, more preferably having 2 to 12 carbon atoms, acyloxy group such as acetoxy, pivaloyloxy, benzoyloxy, dodecanoyloxy), an alkoxycarbonyloxy group (preferably having 2 to 48 carbon atoms, more preferably having 2 to 12 carbon atoms, alkoxycarbonyloxy group such as ethoxycarbonyloxy, t-butoxycarbonyloxy, a cycloalkyloxycarbonyloxy group (for example cyclohexyloxycarbonyloxy)), an aryloxycarbonyloxy group (preferably having 7 to 32 carbon atoms, more preferably having 7 to 18 carbon atoms, aryloxycarbonyloxy group such as phenoxycarbonyloxy), a carbamoyloxy group (preferably having 1 to 48 carbon atoms, more preferably having 1 to 12 carbon atoms, carbamoyloxy group such as N,N-dimethylcarbamoyloxy, N-butylcarbamoyloxy, N-phenylcarbamoyloxy, N-ethyl-N-phenylcarbamoyloxy), a sulfamoyloxy group (preferably having 1 to 32 carbon atoms, more preferably having 1 to 12 carbon atoms, sulfamoyloxy group such as N,N-diethylsulfamoyloxy, N-propylsulfamoyloxy), an alkylsulfonyloxy group (preferably having 1 to 38 carbon atoms, more preferably having 1 to 12 carbon atoms, alkylsulfonyloxy group such as methylsulfonyloxy, hexadecylsulfonyloxy, cyclohexylsulfonyloxy), an arylsulfonyloxy group (preferably having 6 to 32 carbon atoms, more preferably having 6 to 12 carbon atoms, arylsulfonyloxy group such as phenylsulfonyloxy), an acyl group (preferably having 1 to 48 carbon atoms, more preferably having 1 to 12 carbon atoms, acyl group such as formyl, acetyl, pivaloyl, benzoyl, tetradecanoyl, cyclohexanoyl), an alkoxycarbonyl group (preferably having 2 to 48 carbon atoms, more preferably having 2 to 12 carbon atoms, alkoxycarbonyl group such as methoxycarbonyl, ethoxycarbonyl, octadecyloxycarbonyl, cyclohexyloxycarbonyl), an aryloxycarbonyl group (preferably having 7 to 32 carbon atoms, more preferably having 7 to 12 carbon atoms, aryloxycarbonyl group such as phenoxycarbonyl), a carbamoyl group (preferably having 1 to 48 carbon atoms, more preferably having 1 to 12 carbon atoms, carbamoyl group such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, N,N-dicyclohexylcarbamoyl), an amino group (preferably having 32 carbon atoms or less, more preferably having 12 carbon atoms or less, amino group such as amino, methylamino, N,N-dibutylamino, tetradecylamino, 2-ethylhexylamino, cyclohexylamino), an anilino group (preferably having 6 to 32 carbon atoms, more preferably having 6 to 12 carbon atoms, anilino group such as anilino, N-methylanilino), a heterocyclic amino group (preferably having 1 to 32 carbon atoms, more preferably having 1 to 12 carbon atoms, heterocyclic amino group such as 4-pyridylamino), a carbonamide group (preferably having 2 to 48 carbon atoms, more preferably having 2 to 12 carbon atoms, carbonamide group such as acetamide, benzamide, tetradecanamide, pivaloylamide, cyclohexanamide), an ureido group (preferably having 1 to 32 carbon atoms, more preferably having 1 to 12 carbon atoms, ureido group such as ureido, N,N-dimethylureido, N-phenylureido), an imide group (preferably a having 20 carbon atoms or less, more preferably having 12 carbon atoms or less, imide group such as N-succinimide, N-phthalimide), an alkoxycarbonylamino group (preferably having 2 to 48 carbon atoms, more preferably having 2 to 12 carbon atoms, alkoxycarbonylamino group such as methoxycarbonylamino, ethoxycarbonylamino, t-butoxycarbonylamino, octadecyloxycarbonylamino, cyclohexyloxycarbonylamino), an aryloxycarbonylamino group (preferably having 7 to 32 carbon atoms, more preferably having 7 to 12 carbon atoms, aryloxycarbonylamino group such as phenoxycarbonylamino), a sulfonamide group (preferably having 1 to 48 carbon atoms, more preferably having 1 to 12 carbon atoms, sulfonamide group such as methanesulfonamide, butanesulfonamide, benzenesulfonamide, hexadecanesulfonamide, cyclohexanesulfonamide), a sulfamoylamino group (preferably having 1 to 48 carbon atoms, more preferably having 1 to 12 carbon atoms, sulfamoylamino group such as N,N-dipropylsulfamoylamino, N-ethyl-N-dodecylsulfamoylamino), an azo group (preferably having 1 to 48 carbon atoms, more preferably having 1 to 24 carbon atoms, azo group such as phenylazo, 3-pyrazolylazo), an alkylthio group (preferably having 1 to 48 carbon atoms, more preferably having 1 to 12 carbon atoms, alkylthio group such as methylthio, ethylthio, octylthio, cyclohexylthio), an arylthio group (preferably having 6 to 48 carbon atoms, more preferably having 6 to 12 carbon atoms, arylthio group such as phenylthio), a heterocyclic thio group (preferably having 1 to 32 carbon atoms, more preferably having 1 to 12 carbon atoms, heterocyclic thio group such as 2-benzothiazolylthio, 2-pyridylthio, 1-phenyltetrazolylthio), an alkylsulfinyl group (preferably having 1 to 32 carbon atoms, more preferably having 1 to 12 carbon atoms, alkylsulfinyl group such as decanesulfinyl), an arylsulfinyl group (preferably a having 6 to 32 carbon atoms, more preferably having 6 to 12 carbon atoms, arylsulfinyl group such as phenylsulfinyl), an alkylsulfonyl group (preferably a 1 to 48 carbon atoms, more preferably having 1 to 12 carbon atoms, alkylsulfonyl group such as methylsulfonyl, ethylsulfonyl, propylsulfonyl, butylsulfonyl, isopropylsulfonyl, 2-ethylhexylsulfonyl, hexadecylsulfonyl, octylsulfonyl, cyclohexylsulfonyl), an arylsulfonyl group (preferably having 6 to 48 carbon atoms, more preferably having 6 to 12 carbon atoms, arylsulfonyl group such as phenylsulfonyl, 1-naphthylsulfonyl), a sulfamoyl group (preferably having 32 carbon atomsor less, more preferably having 16 carbon atoms or less, sulfamoyl group such as sulfamoyl, N,N-dipropylsulfamoyl, N-ethyl-N-dodecylsulfamoyl, N-ethyl-N-phenylsulfamoyl, N-cyclohexylsulfamoyl), a sulfo group, a phosphonyl group (preferably having 1 to 32 carbon atoms, more preferably having 1 to 12 carbon atoms, phosphonyl group such as phenoxyphosphonyl, octyloxyphosphonyl, phenylphosphonyl), a phosphinoylamino group (preferably having 1 to 32 carbon atoms, more preferably having 1 to 12 carbon atoms, phosphinoylamino group such as diethoxyphosphinoylamino, dioctyloxyphosphinoylamino), etc.

When the aforementioned $R^1$ is a substitutable group, the group represented by $R^1$ may further have a substituent group represented by $R^1$. And when the $R^1$ has two or more substituent groups, the plural substituent groups may be the same or different.

In the formula (I), $R^2$, $R^3$, $R^4$ and $R^5$ each independently represent a hydrogen atom or a substituent group. The substituent groups represented by $R^2$ to $R^5$ have the same meanings as those of the substituent group represented by the aforementioned $R^1$, and preferable embodiments thereof are also the same as described therein. When $R^2$ to $R^5$ are substitutable groups, each of the groups represented by $R^2$ to $R^5$ may further have a substituent group represented by $R^1$, and when it has two or more substituent groups, the plural substituent groups may be the same or different.

In the formula (I), $R^6$ and $R^7$ each independently represent an alkyl group, alkenyl group, aryl group or heterocyclic group. The alkyl group, alkenyl group, aryl group and heterocyclic group represented by $R^6$ and $R^7$ have the same meanings as those of the alkyl group, alkenyl group, aryl group or heterocyclic group enumerated as the substituent group represented by the aforementioned $R^1$, and preferable embodiments thereof are the same as described therein.

When $R^6$ and $R^7$ are substitutable groups, each of the groups represented by $R^6$ and $R^7$ may further be substituted with a substituent group represented by $R^1$. And when it is substituted with two or more substituent groups, the plural substituent groups may be the same or different.

In the foregoing description, $R^2$ and $R^3$, $R^3$ and $R^6$, $R^4$ and $R^5$, $R^5$ and $R^7$, or $R^6$ and $R^7$ each independently may be bonded to each other to form a 5-, 6- or 7-membered ring. The 5-, 6- or 7-membered ring is preferably cyclopentene, cyclohexene, cycloheptene, dihydropyrrole, tetrahydropyridine or the like, and the ring may be substituted with a substituent group represented by the aforementioned $R^1$. When it is substituted with two or more substituent groups, the plural substituent groups may be the same or different.

In the formula (I), Za and Zb each independently represent —N= or —C($R^8$)=; $R^8$ represents a hydrogen atom, alkyl group, aryl group or heterocyclic group.

The alkyl group, aryl group or heterocyclic group represented by the aforementioned $R^8$ has the same meanings as those of the alkyl group, aryl group or heterocyclic group enumerated as the substituent group represented by the aforementioned $R^1$. And preferable embodiments thereof are the same as described therein.

When the group represented by $R^8$ is a substitutable group, each group represented by $R^8$ may further be substituted wig a substituent group represented by $R^1$. And when it is substituted with two or more substituent groups, the plural substituent groups may be the same or different.

The azomethine-type dye represented by the formula (I) is preferably an azomethine-type dye (dye) represented by the following formula (II):

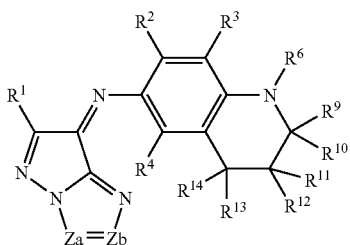

Formula (II)

In the formula (II), $R^9$ to $R^{14}$ each independently represent a hydrogen atom or a substituent group. In the formula (II), $R^1$, $R^2$, $R^3$, $R^4$ and $R^6$ have the same meanings as those of $R^1$ to $R^4$ and $R^6$ in the formula (I), and preferable embodiments thereof are also the same as described therein. Za and Zb in the formula (II) have the same meanings as those of Za and Zb in the formula (I), and preferable embodiments thereof are also the same as described therein.

The substituent groups represented by the aforementioned $R^9$ to $R^{14}$ have the same meanings as those of the substituent group represented by $R^1$ in the formula (I), and preferable embodiments thereof are the same as described therein. When the substituent groups represented by $R^9$ to $R^{14}$ are substitutable groups, each of the groups represented by $R^9$ to $R^{14}$ may further be substituted with a substituent group represented by $R^1$. And when it is substituted with two or more substituent groups, the plural substituent groups may be the same or different.

$R^2$ and $R^3$, $R^3$ and $R^6$, $R^6$ and $R^9$, or $R^4$ and $R^{14}$ each independently may be bonded to each other to form a 5-, 6- or 7-membered ring. The 5-, 6- or 7-membered ring is preferably cyclopentene, cyclohexene, cycloheptene, dihydropyrrole, tetrahydropyridine or the like.

When the substituent group represented by $R^1$, $R^2$, $R^3$ or $R^4$ in the formula (II) is a substitutable group, each of the groups represented by $R^1$ to $R^4$ may further be substituted with a substituent group represented by $R^1$ in the formula (I) above, and when it is substituted with two or more substituent groups, the plural substituent groups may be the same or different.

The azomethine-type dye represented by the formula (II) is more preferably an azomethine-type dye represented by the following formula (III):

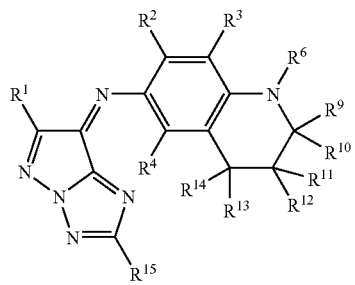

Formula (III)

In the formula (III), $R^{15}$ represents a hydrogen atom, alkyl group, aryl group or heterocyclic group. In the formula (III), $R^1$ to $R^4$, $R^6$ and $R^9$ to $R^{14}$ have the same meanings as those of $R^1$ to $R^4$, $R^6$ and $R^9$ to $R^{14}$ in the formula (I) or (II), and preferable embodiments thereof are also the same as described above.

The alkyl group, aryl group and heterocyclic group represented by the aforementioned $R^{15}$ have the same meanings as those of the alkyl group, aryl group and heterocyclic group enumerated as the substituent group represented by $R^1$ in the formula (I), and preferable embodiments thereof are also the same as described above.

Each group represented by $R^{15}$ may be substituted with a substituent group represented by $R^1$ in the formula (I), and when it is substituted with two or more substituent groups, the plural substituent groups may be the same or different.

The azomethine-type dyes represented by the formula (III) are preferably the following embodiment.

In the azomethine-type dyes represented by the formula (III), $R^1$ is preferably an alkyl group, alkenyl group, aryl group, heterocyclic group, hydroxyl group, cyano group, alkoxy group, aryloxy group, heterocyclic oxy group, carbamoyloxy group, acyl group, alkoxycarbonyl group, aryloxycarbonyl group, carbamoyl group, imido group, azo group, alkylthio group, arylthio group, heterocyclic thio group, alkylsulfinyl group, arylsulfinyl group, alkylsulfonyl group, arylsulfonyl group, sulfamoyl group, sulfo group, phophonyl group or phosphinoylamino group, each of $R^2$, $R^3$ and $R^4$ is preferably a hydrogen atom, halogen atom, alkyl group, alkenyl group, aryl group, heterocyclic group, alkoxy group, aryloxy group, alkoxycarbonyl group, carbamoyl group, amino group, anilino group, carbonamide group, ureido group, alkoxycarbonylamino group, sulfonamide group, sulfamoylamino group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group or phosphinoylamino group, $R^6$ is preferably an alkyl group, alkenyl group, aryl group or heterocyclic group, $R^{15}$ is preferably a hydrogen atom, alkyl group, aryl group or heterocyclic group, and each of $R^9$ to $R^{14}$ is preferably a hydrogen atom, halogen atom, alkyl group or alkoxy group.

In the azomethine-type dyes represented by the formula (III), $R^1$ is more preferably an alkyl group, alkenyl group, aryl group, heterocyclic group, alkoxycarbonyl group, carbamoyl group, imido group, alkylthio group, arylthio group, heterocyclic thio group, alkylsulfonyl group or arylsulfonyl group, each of $R^2$, $R^3$ and $R^4$ is more preferably a hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group, $R^6$ is more preferably an alkyl group, alkenyl group, aryl group or heterocyclic group, $R^{15}$ is more preferably a hydrogen atom, alkyl group, aryl group or heterocyclic group, and each of $R^9$ to $R^{14}$ is more preferably a hydrogen atom or alkyl group.

In the azomethine-type dyes represented by the formula (III), $R^1$ is more preferably an alkyl group, aryl group, heterocyclic group, alkoxycarbonyl group, carbamoyl group, alkylthio group, arylthio group, alkylsulfonyl group or arylsulfonyl group, each of $R^2$, $R^3$ and $R^4$ is more preferably a hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group, $R^6$ is more preferably an alkyl group or aryl group, $R^{15}$ is more preferably a hydrogen atom, alkyl group, aryl group or heterocyclic group, and each of $R^9$ to $R^{14}$ is more preferably a hydrogen atom or alkyl group.

In the azomethine-type dyes represented by the formula (III), $R^1$ is more preferably an alkyl group, each of $R^2$, $R^3$ and $R^4$ is more preferably a hydrogen atom, halogen atom, alkyl group or alkoxy group, $R^6$ is more preferably an alkyl group, $R^{15}$ is more preferably an alkyl group, aryl group or heterocyclic group, and each of $R^9$ to $R^{14}$ is more preferably a hydrogen atom or alkyl group.

It is most preferable in the dyes represented by the formula (III) that $R^1$ is a tertiary alkyl group preferably a having 4 to 16 carbon atoms, more preferably having 4 to 8 carbon atoms, tertiary alkyl group such as t-butyl, t-amyl, t-octyl, 1-adamantyl), each of $R^2$, $R^3$ and $R^4$ is each independently a hydrogen atom, a halogen atom (for example a fluorine atom, chlorine atom, bromine atom or iodine atom, preferably a fluorine atom or chlorine atom), an alkyl group (preferably having 1 to 12 carbon atoms, more preferably having 1 to 8 carbon atoms, alkyl group such as methyl, ethyl, propyl, isopropyl, t-butyl, cyclohexyl, 2-ethylhexyl), or an alkoxy group (preferably having 1 to 12 carbon atoms, more preferably having 1 to 8 carbon atoms, alkoxy group such as methoxy, ethoxy, isopropyloxy, octyloxy, 2-ethylhexyloxy), $R^6$ is an alkyl group (preferably having 1 to 18 carbon atoms, more preferably having 1 to 12 carbon atoms, alkyl group such as methyl, ethyl, propyl, isopropyl, octyl, 2-ethylhexyl, 2-hydroxyethyl, 3-hydroxypropyl), $R^{15}$ is an alkyl group (preferably having 1 to 24 carbon atoms, more preferably having 1 to 18 carbon atoms, alkyl group such as methyl, ethyl, isopropyl, t-butyl, 2-ethylhexyl, dodecyl, hexadecyl), an aryl group (preferably having 6 to 24 carbon atoms, more preferably having 6 to 12 carbon atoms, aryl group such as phenyl, naphthyl), or a heterocyclic group (preferably having 1 to 12 carbon atoms, more preferably having 2 to 12 carbon atoms, heterocyclic group such as 2-thienyl, 4-pyridyl, 2-pyridyl, 2-imidazolyl, 3-pyrazolyl), each of $R^9$ and $R^{10}$ is an alkyl group (preferably having 1 to 8 carbon atoms, more preferably having 1 to 4 carbon atoms, alkyl group such as methyl, ethyl, propyl (most preferably methyl), each of $R^{11}$ to $R^{13}$ is a hydrogen atom, and $R^{14}$ is an alkyl group (preferably having 1 to 8 carbon atoms, more preferably having 1 to 4 carbon atoms, alkyl group such as methyl, ethyl, propyl (most preferably methyl)).

Specific examples (exemplary days M-1 to M-84) of the azomethine-type dyes represented by the formula (I) are shown below. However, the invention is not limited to these examples.

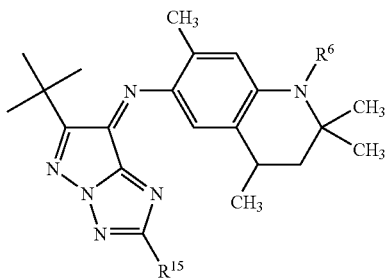

| Exemplary Dye | $R^{15}$ | $R^6$ |
|---|---|---|
| M-1 | 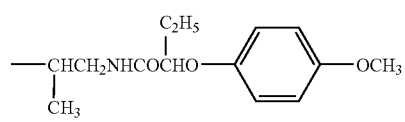 | —$CH_2CH_2CH_2OH$ |
| M-2 | the same as above | —$CH_2CH_2OH$ |
| M-3 | the same as above | —$CH_2COOC_2H_5$ |
| M-4 | the same as above | —$CH_2CH_2CH_2COOH$ |
| M-5 | the same as above | —$C_3H_7(iso)$ |
| M-6 | 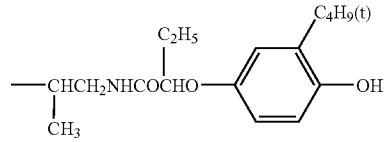 | —$CH_2CH(C_2H_5)C_4H_9$ |

-continued
| | | |
|---|---|---|
| M-7 | 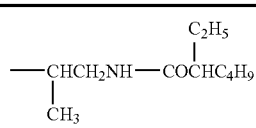 | —CH$_2$CH$_2$NHSO$_2$CH$_3$ |
| M-8 | 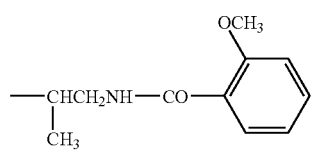 | —CH$_2$CH$_2$CH$_2$COOH |
| M-9 | 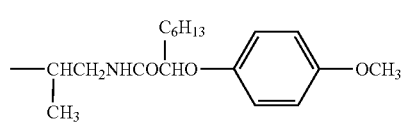 | —CH$_2$CH$_2$CH$_2$OH |
| M-10 | 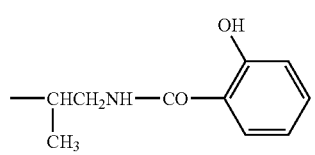 | —CH$_2$CH$_2$CH$_2$OH |
| M-11 | 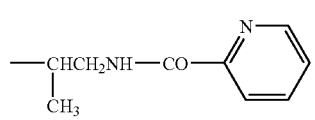 | —CH$_2$CH$_2$CH$_2$OH |
| M-12 | 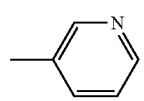 | —CH$_2$CH$_2$CH$_2$OH |
| M-13 | 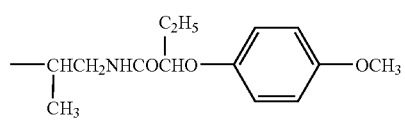 | 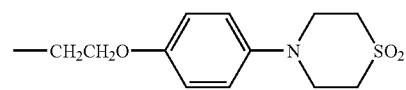 |
| M-14 | 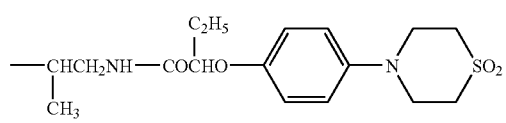 | 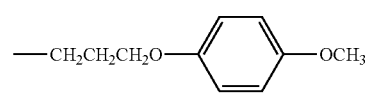 |
| M-15 | 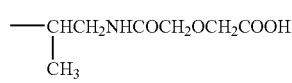 | —CH$_2$CH(C$_2$H$_5$)C$_4$H$_9$ |
| M-16 | 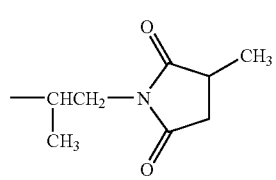 | —CH$_2$CH(C$_2$H$_5$)C$_4$H$_9$ |
| M-17 | 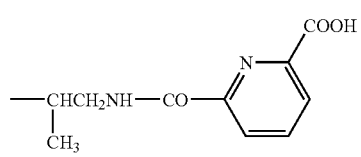 | —C$_8$H$_{17}$ |
| M-18 | 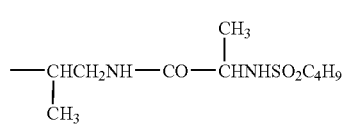 | —C$_8$H$_{17}$ |

-continued

| | | |
|---|---|---|
| M-19 | ![structure: -C(CH3)2CH2NHCO-C6H4(m-NHSO2CH3)] | —CH₂CH₂CH₂OH |
| M-20 | —CH(CH₃)CH₂NHSO₂C₄H₉ | —CH₂CH₂CH₂OH |
| M-21 | —CH(CH₃)CH₂NHSO₂C₈H₁₇ | —CH₂CH₂CH₂OH |
| M-22 | —CH(CH₃)CH₂NHSO₂C₁₆H₃₃ | —C₂H₅ |
| M-23 | —CH(CH₃)CH₂NHSO₂CH₃ | —CH₂CH₂CH₂O-C₆H₄-OCH₃ |
| M-24 | —CH(CH₃)CH₂NHSO₂-C₆H₅ | —CH₂CH₂CH₂O-C₆H₄-OCH₃ |
| M-25 | —CH(CH₃)CH₂NHSO₂-C₆H₄-CH₃ | —CH₂CH₂CH₂OH |
| M-26 | —CH(CH₃)CH₂NHSO₂-C₆H₄-C₄H₉(iso) | —CH₂CH₂CH₂OH |
| M-27 | —CH(CH₃)CH₂NHSO₂-C₆H₄(m-COOH) | —C₈H₁₇ |
| M-28 | —C₆H₄(m-NHSO₂CH₃) | —CH₂CH(C₂H₅)C₄H₉ |
| M-29 | —C₆H₄(p-NHSO₂CH₃) | —CH₂CH(C₂H₅)C₄H₉ |
| M-30 | —C₆H₄(o-NHSO₂CH₃) | —C₁₂H₂₅ |
| M-31 | —C₆H₃(3,4-Cl₂) | —C₁₂H₂₅ |

-continued

| | | |
|---|---|---|
| M-32 | [structure: 3-methylphenyl with NHSO₂-phenyl] | —CH₂CH₂OH |
| M-33 | [structure: 3-methylphenyl with N-maleimide] | —CH₂CH₂OH |
| M-34 | [structure: benzene with NH₂, CH₃, COOH substituents] | —CH₂CH(C₂H₅)C₄H₉ |
| M-35 | [structure: benzene with NHSO₂CH₃, CH₃, COOH substituents] | —CH₂CH₂CH₂O—C₆H₄—OCH₃ |
| M-36 | the same as above | —CH₂CH₂O—C₆H₄—N(thiomorpholine-S,S-dioxide) |
| M-37 | [structure: 6-methylpyridine-2-carboxylic acid] | —CH₂CH₂CH₂O—C₆H₄—OCH₃ |
| M-38 | —CF₃ | the same as above |
| M-39 | —C₇F₁₅ | the same as above |
| M-40 | —CHCH₂NHSO₂C₈H₁₇<br>    \|<br>    CH₃ | —CH₂CH₂SO₂CH₃ |
| M-41 | the same as above | —CH₂CH₂SC₄H₉ |
| M-42 | the same as above | —CH₂CH₂OCH₂CH₂OCH₃ |
| M-43 | [complex pyrazolotriazole structure with t-Bu, CH₃, CH₂CH₂NHSO₂CH₃, C₂H₅, and CHCH₂NHCOCHO-C₆H₄-OC₄H₉ with CH₃ substituents] | |

-continued
M-44
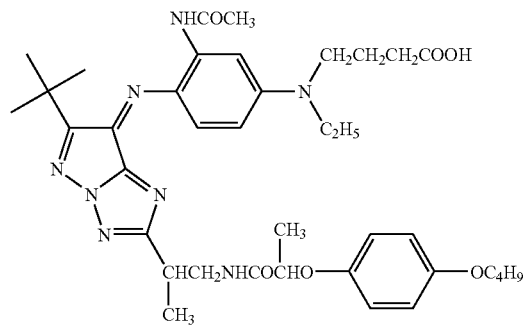
M-45
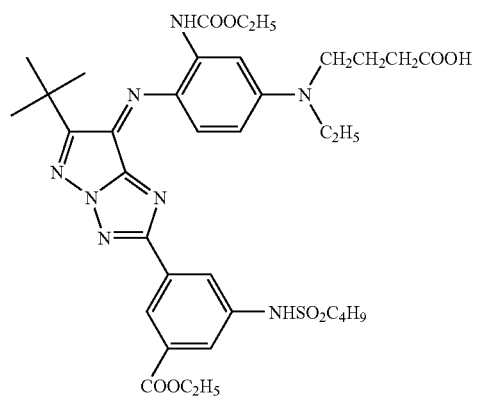
M-46
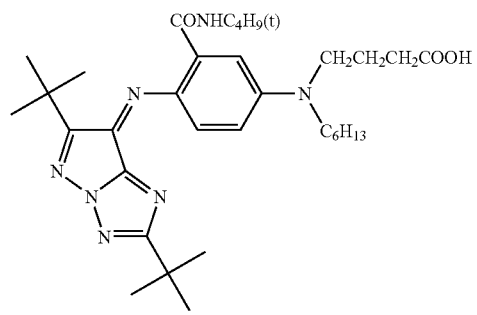
M-47
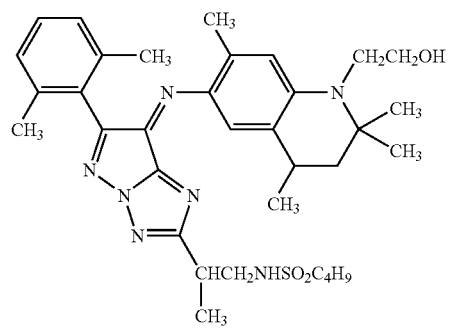

M-48
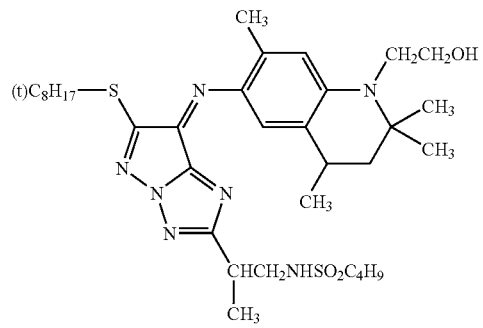
M-49
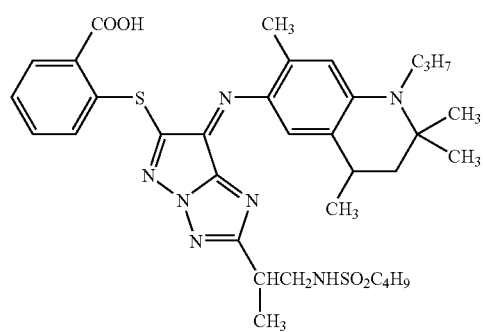
M-50
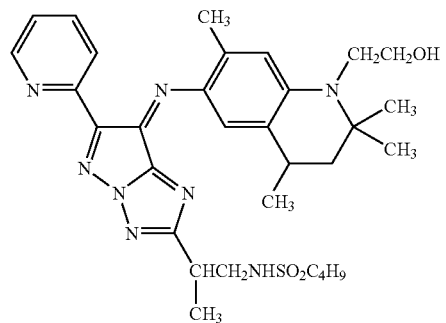
M-51
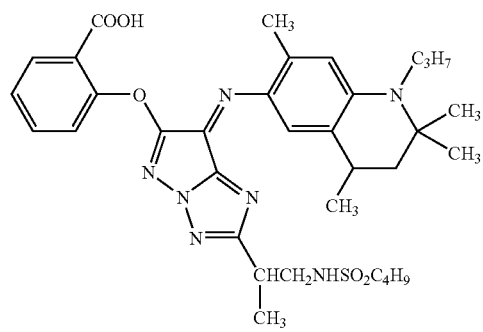

M-52
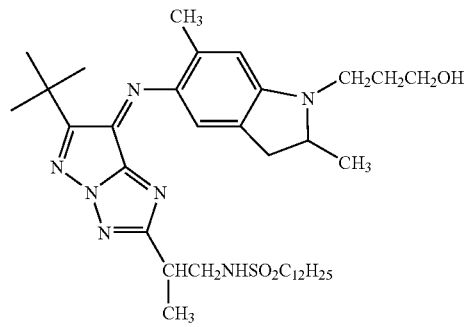
M-53
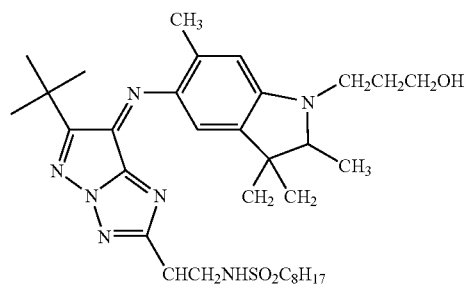
M-54
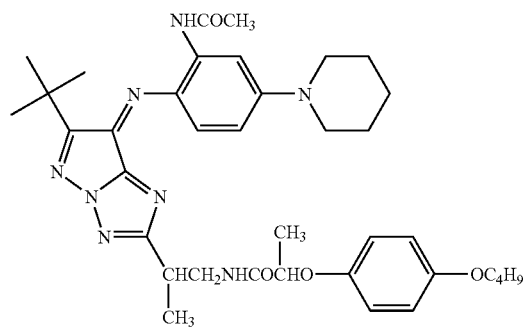
M-55
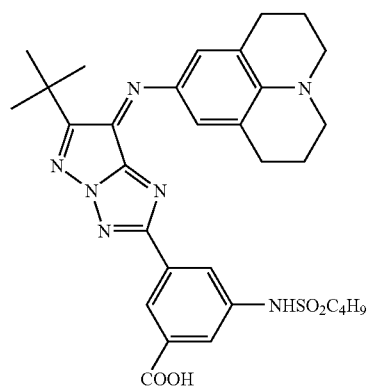

M-56
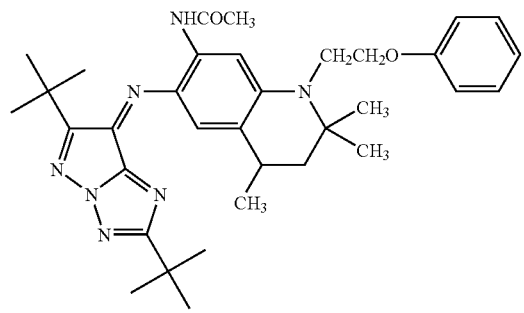
M-57
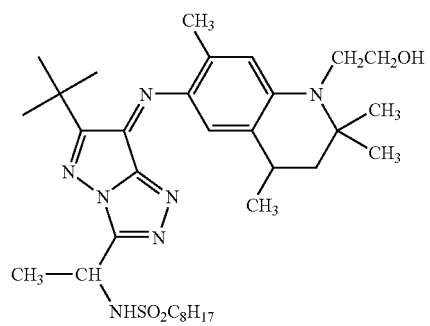
M-58
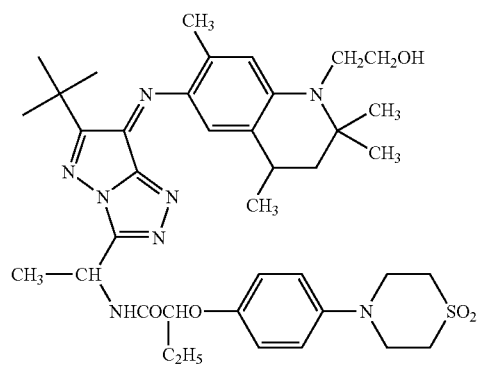
M-59
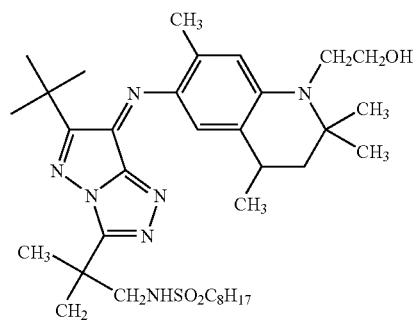

M-60
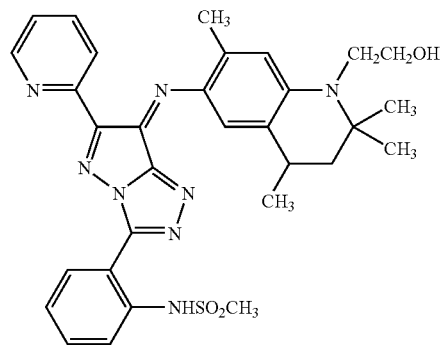
M-61
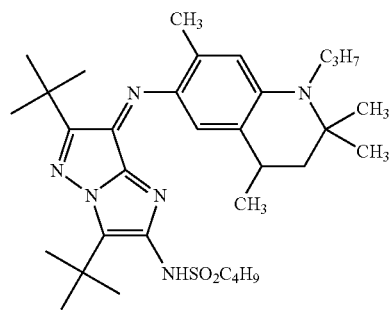
M-62
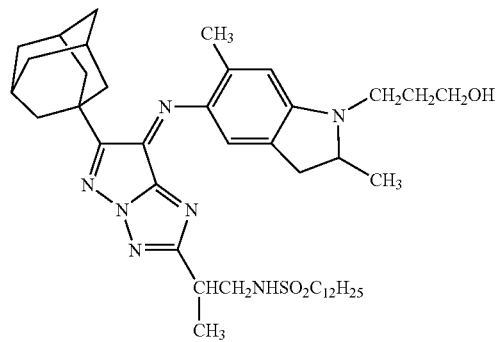
M-63
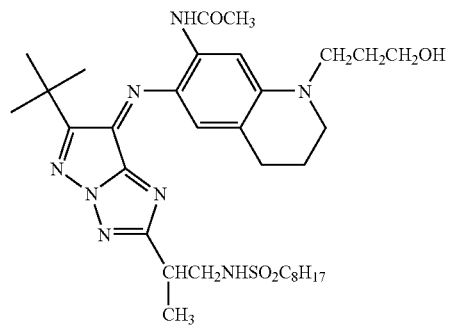

M-64
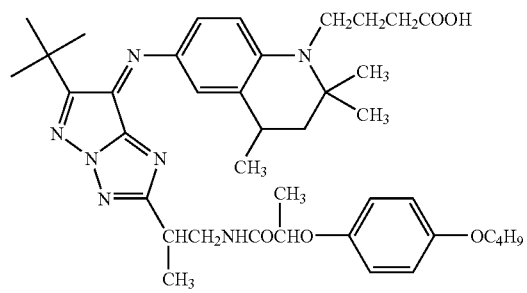
M-65
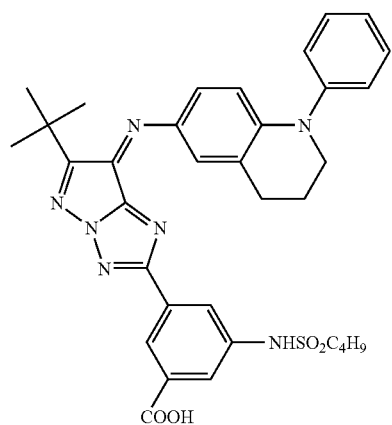
M-66
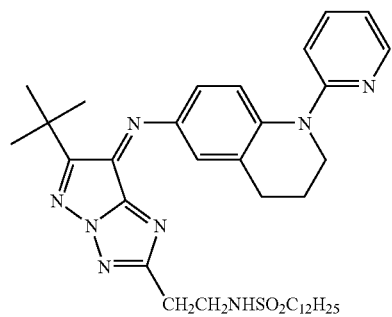
M-67
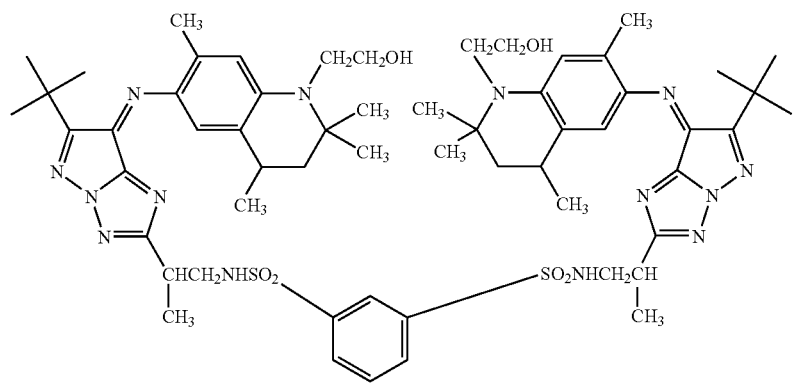

M-68
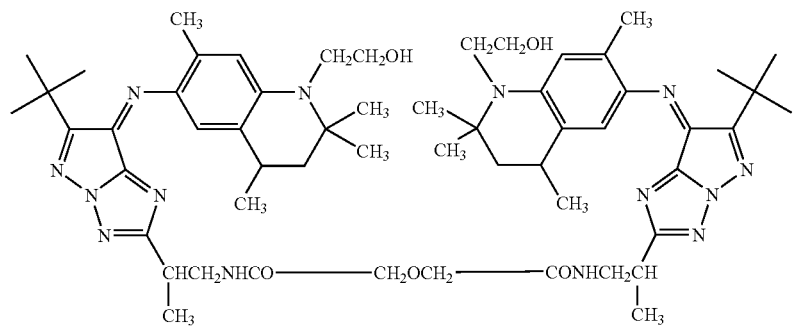
M-69
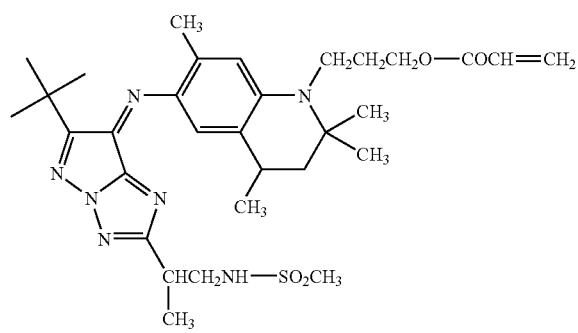
M-70
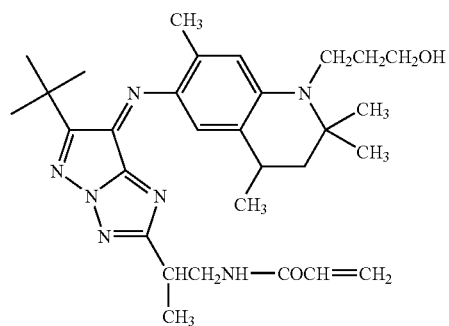
M-71
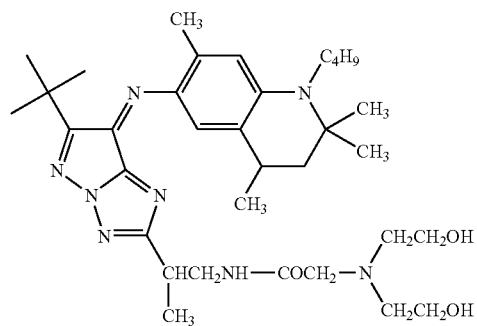

M-72
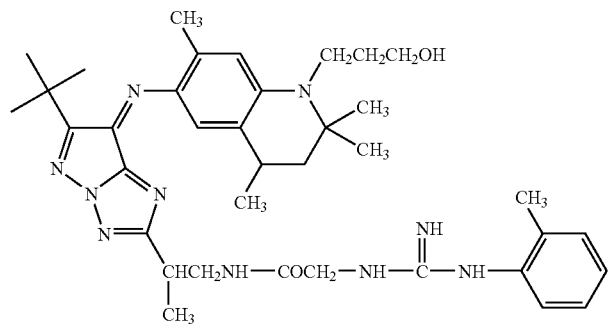
M-73
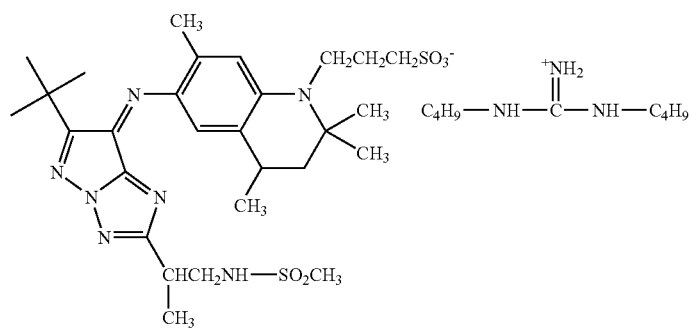
M-74
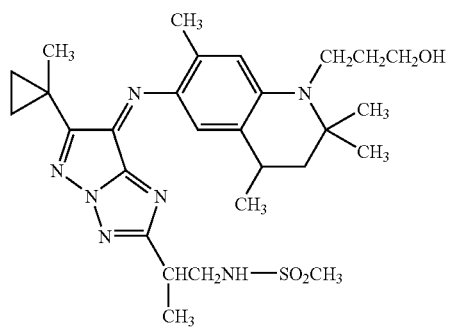
M-75
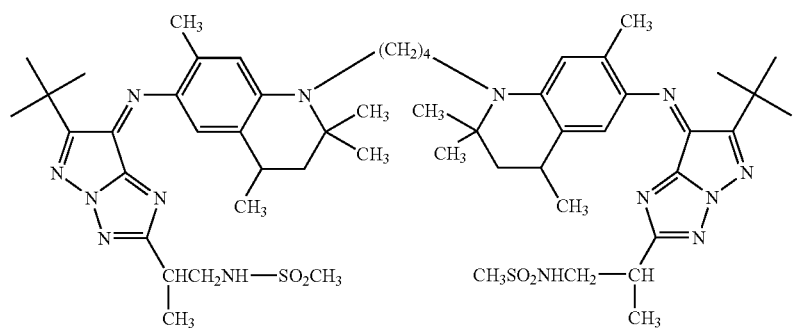

M-76
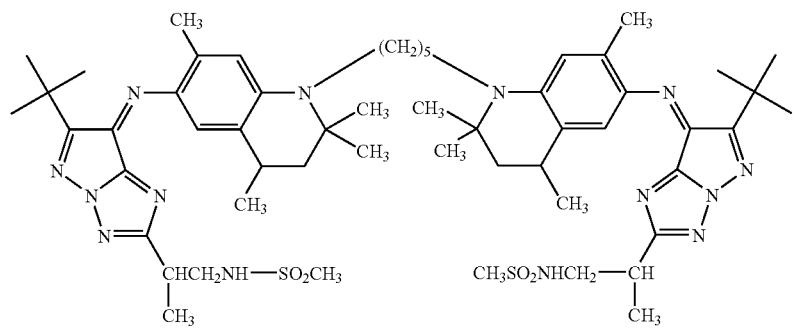
M-77
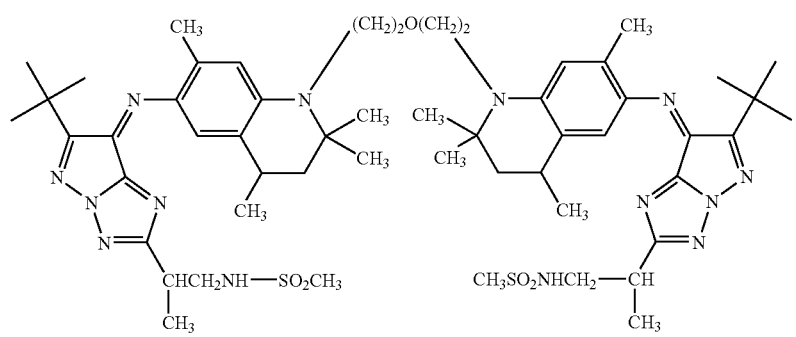
M-78
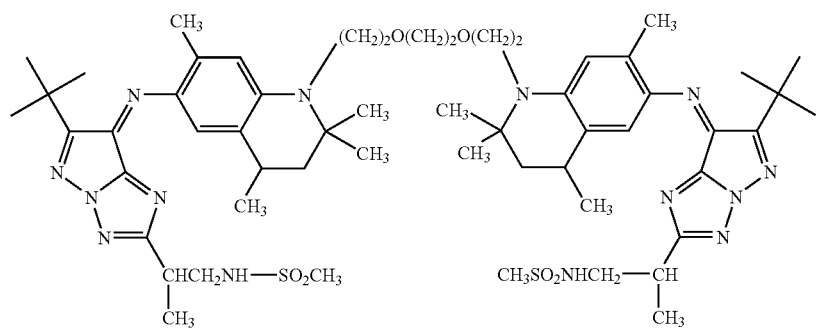
M-79
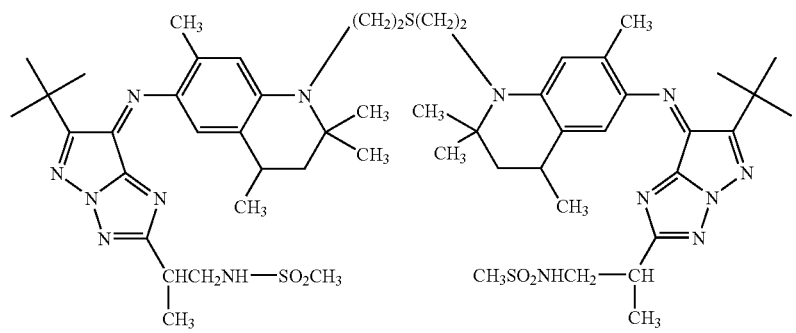

M-80
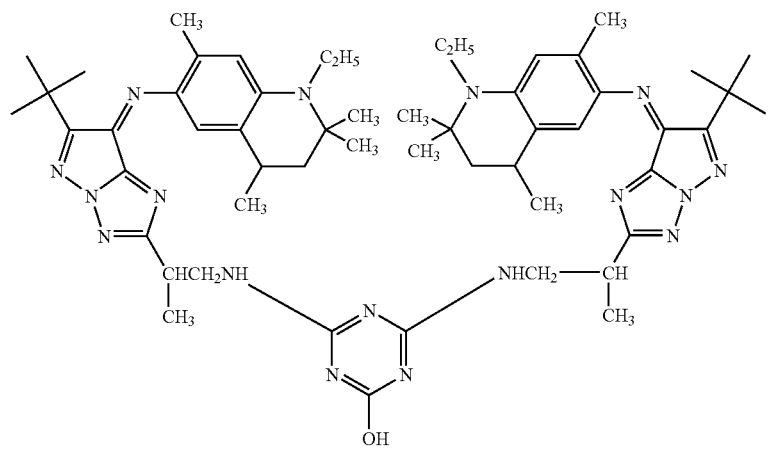
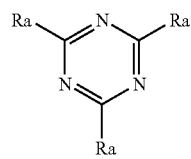
M-81
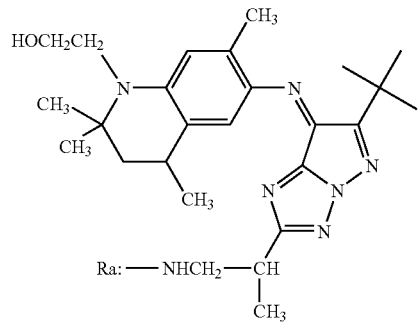
M-82
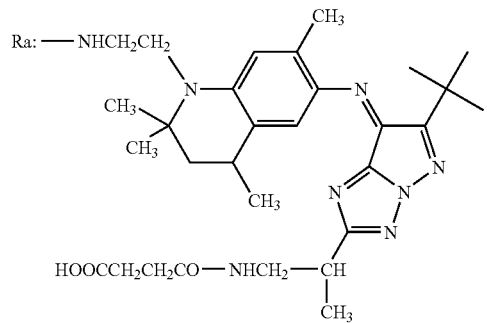

-continued
M-83
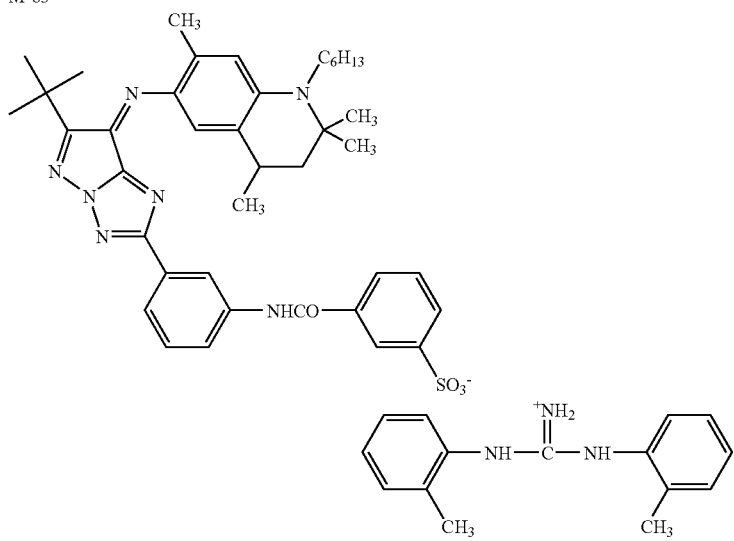
M-84
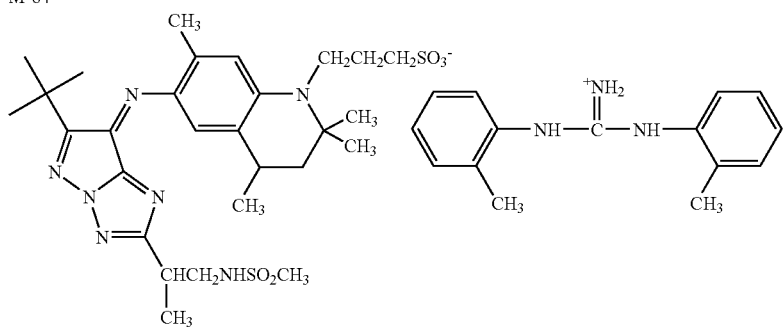
SYNTHESIS EXAMPLE
Now, an example of synthesis of the azomethine type dye represented by the formula (I) is described in more detail by reference to synthesis of an exemplary dye M-1 as the above exemplary dye in the following schemes A and B.
[Scheme A]
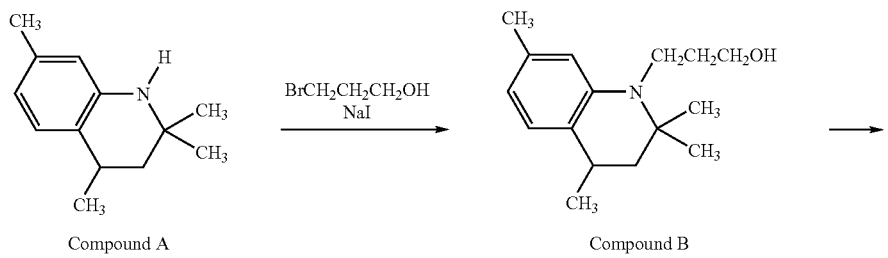
Compound A     Compound B

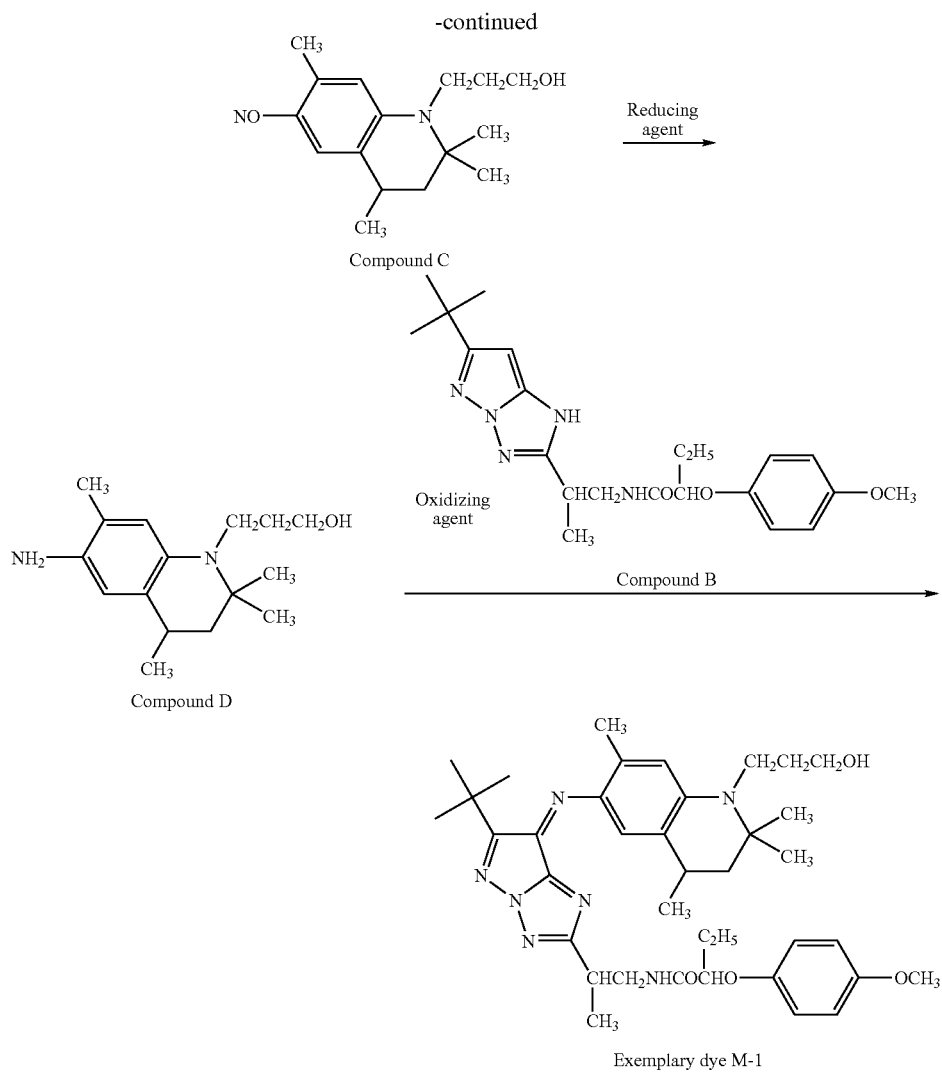

Exemplary dye M-1

(1) Synthesis of Compound B

As shown in the scheme A, 300 ml dimethyl imidazolidinone was added to a mixture of 94.7 g (0.5 mole) of Compound A (manufactured by Sigma Aldrich), 37.5 g (0.25 mole) of sodium iodide and 126 g (1.5 moles) of sodium bicarbonate, and the mixture was stirred. 90.3 g (0.65 mole) of 3-bromopropanol was dropped into the solution, and after dropping was finished, the mixture was heated at 95 to 100° C. for 5 hours under stirring, to complete the reaction. After the reaction was finished, the reaction solution was cooled to room temperature and extracted with 600 ml water and 500 ml ethyl acetate. Then, the ethyl acetate phase was washed with water and dried over magnesium sulfate anhydride. This ethyl acetate phase was concentrated under reduced pressure and purified by silica gel column chromatography (eluent: n-hexane/ethyl acetate=10/1) to give 90.5 g Compound B (yield 73.2%).

(2) Synthesis of Compound C 270 ml methanol was added to 90 g (0.364 mole) of Compound B obtained above, then cooled to 5° C. and stirred. 93.7 ml (1.09 moles) of concentrated hydrochloric acid was dropped into this solution, and a solution prepared by dissolving 27.6 g (0.4 mole) of sodium nitrite in 75 ml water was dropped into it at a temperature kept at 5 to 10° C. After dropping was finished, the mixture was stirred at 5 to 10° C. for 2 hours to complete the reaction. After the reaction was finished, 500 ml ethyl acetate and 1000 ml water were added thereto, and after the mixture was neutralized by adding 84 g sodium bicarbonate little by little, the aqueous phase was removed. Then, the ethyl acetate phase was washed with water, dried over magnesium sulfate anhydride and concentrated under reduced pressure to precipitate crystals. 200 ml n-hexane and 200 ml ethyl acetate were added to the crystals and then stirred to disperse the crystals. The crystals were filtered and dried to give 78 g Compound C (yield 77.6%).

(3) Synthesis of Compound E

Now, synthesis of Compound E was conducted by a method shown in the following scheme B.

[Scheme B]

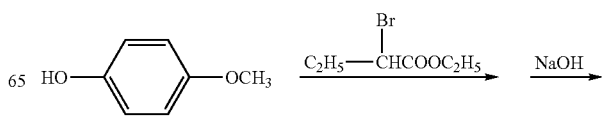

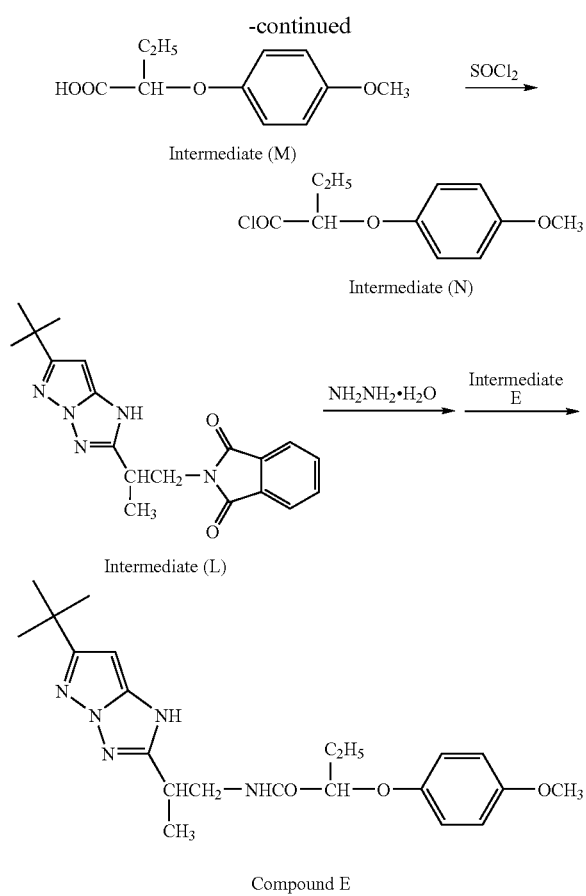

Synthesis of Intermediate (M)

600 ml dimethyl acetamide was added to 112 g (0.9 mole) of 4-methoxy phenol and stirred at room temperature. 196 ml solution of 28% sodium methoxide in methanol was added to the resulting solution. After this addition was finished, 190 g (0.97 mole) of ethyl 2-bromobutanoate was dropped into the solution, and after dropping was finished, the mixture was stirred at room temperature for 3 hours to complete the reaction. 1000 ml water and 1000 ml ethyl acetate were added to the reaction solution which was then extracted with ethyl acetate. After the ethyl acetate phase was washed with salt water, the ethyl acetate was distilled away under reduced pressure, and 250 ml methanol was added to the resulting residues which were then stirred at room temperature. Subsequently, an aqueous solution prepared by dissolving 144 g sodium hydroxide in 1000 ml water was added to the solution. Subsequently, the solution was heated at 50 to 55° C. and stirred for 2 hours. After the reaction was finished, the reaction solution was acidified by dropping 340 ml concentrated hydrochloric acid into it. Then, the reaction solution was extracted with 1000 ml ethyl acetate, and the ethyl acetate phase was washed with salt water and dried over sodium sulfate anhydride. The ethyl acetate phase was concentrated under reduced pressure to give Intermediate (M) quantitatively.

Synthesis of Intermediate (N)

400 ml toluene was added to 93.1 g (0.433 mole) of Intermediate (M) obtained above, and then heated at 85 to 90° C. under stirring. 50 ml thionyl chloride was dropped into the solution and heated for 3 hours under stirring. After the reaction was finished, toluene and an excess of thionyl chloride were distilled away under reduced pressure. Then, the reaction mixture was cooled to room temperature, and 100 ml ethyl acetate was added thereto, whereby a solution of Intermediate (N) in ethyl acetate was obtained.

Synthesis of Compound E

Intermediate (L) was obtained by the same method as described in JP-A 2-201443 that 5-amino-3-tert-butyl pyrazole (synthesized by a method described in Japanese Patent No. 2670943) was used in place of a starting material 5-amino-3-methyl pyrazole. 570 ml 2-propanol was added to 189 g (0.538 mole) of Intermediate (L) and heated under stirring. 33.6 g (0.673 mole) of hydrazine monohydrate was dropped into the solution and heated for 2 hours under stirring. After the reaction was finished, about 400 ml 2-propanol was distilled away under reduced pressure. Then, 420 g sodium bicarbonate, 1500 ml water and 1200 ml ethyl acetate were added to the resulting residues which were then stirred at room temperature.

Then, a solution of the above intermediate (N) in ethyl acetate was dropped into this solution, and after dropping was finished, the mixture was stirred at room temperature for 2 hours, and subsequently the aqueous phase was removed. Then, the ethyl acetate phase was washed with water to precipitate crystals. 1200 ml n-hexane was added to this dispersion and stirred for 1 hour, and then the crystals were filtered, washed with water and dried to give 159 g Compound E (yield 86.9%).

(4) Synthesis of Exemplary Dye M-1

According to the scheme A shown above, 50 ml methanol, 100 ml ethyl acetate and 100 ml water were then added to 7.35 g (0.0266 mole) of Compound C obtained above, and then heated at 40° C. under stirring. 25 g sodium hydrosulfite was added little by little to the solution, and after this addition was finished, the mixture was reacted at 40° C. for 1 hour to give Compound D. After the reaction was finished, the reaction mixture was cooled to room temperature, and then 100 ml ethyl acetate and 200 ml water were added thereto, followed by removing the aqueous phase, to give an ethyl acetate phase containing Compound D, and this ethyl acetate phase was used below.

Subsequently, 100 ml methanol and 200 ml water were added to 10.0 g (0.0242 mole) of Compound E obtained above and 21 g sodium bicarbonate, and the mixture was stirred at room temperature, and after the whole amount of the ethyl acetate phase described above was added thereto, an aqueous solution prepared by 12 g ammonium persulfate in 100 ml water was dropped into it. After dropping was finished, the mixture was reacted at room temperature for 1 hour. After the reaction was finished, the aqueous phase was removed, and then the ethyl acetate phase was washed with water, and the ethyl acetate phase was concentrated under reduced pressure. Then, the resulting residues were purified by silica gel column chromatography (eluent: n-hexane/ethyl acetate=1/1) to give amorphous exemplary dye M-1.

When the maximum absorption wavelength ($\lambda_{max}$) and molar absorption coefficient ($\epsilon$) of the resulting dye in ethyl acetate were measured by a spectrophotometer UV-2400PC (Shimadzu Corporation), the maximum absorption wavelength ($\lambda_{max}$) was 556 nm, and the molar absorption coefficient ($\epsilon$) was 5,5000.

Other exemplary dyes other than the dye M-1 described above can also be synthesized by the same method as described above.

Tetraazaporphyrin-type Dye Represented by the Formula (A)

The negative dye-containing curable composition of the invention comprises at least one kind of tetraazaporphyrin-type dye represented by the following formula (A). This dye exhibits an excellent cyan hue with high transmittance, is excellent in stability without precipitation with time upon conversion into a liquid preparation or a coating film and has excellent resistance particularly to heat or light.

Formula (A)

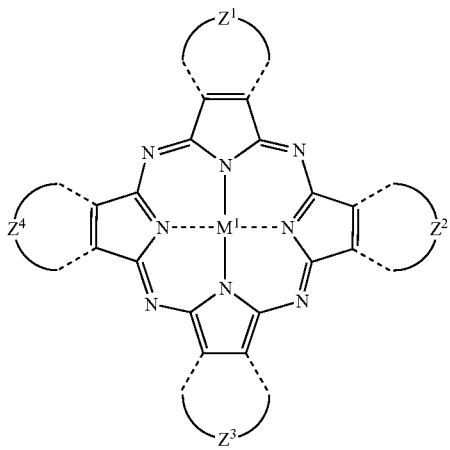

In the formula (A), $M^1$ represents a metal, and $Z^1$, $Z^2$, $Z^3$ and $Z^4$ each independently represent an atomic group forming a 6-membered ring composed of atoms selected from a carbon atom and a nitrogen atom.

In the formula (A), $M^1$ represents a metal, and the metal includes Zn, Mg, Si, Sn, Rh, Pt, Pd, Mo, Mn, Pb, Cu, Ni, Co and Fe, metal chlorides such as AlCl, InCl, FeCl, $TiCl_2$, $SnCl_2$, $SiCl_2$ and $GeCl_2$, metal oxides such as TiO and VO, and metal hydroxides such as $Si(OH)_2$.

In the formula (A), $Z^1$, $Z^2$, $Z^3$ and $Z^4$ each independently represent an atomic group forming a 6-membered ring composed of atoms selected from a carbon atom and a nitrogen atom. The 6-membered ring may be a saturated ring or an unsaturated ring, may be substituted or unsubstituted, and may have another 5- or 6-membered ring condensed therewith. The 6-membered ring includes a benzene ring, cyclohexane ring etc. The substituent possessed by the 6-membered ring includes the substituent groups described in the aforementioned $R^1$. When the 6-membered ring has two or more substituent groups, the substituent groups may be the same or different.

The tetraazaporphyrin-type dye represented by the formula (A) is particularly preferably a phthalocyanine dye represented by the following formula (B):

Formula (B)

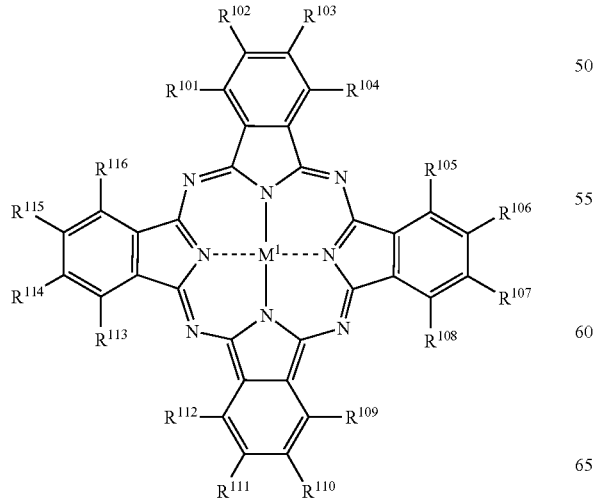

In the formula (B), $M^1$ has the same meaning as in $M^1$ in the formula (A) above, and preferable embodiments thereof are also the same as described therein.

In the formula (B), $R^{101}$ to $R^{116}$ each independently represent a hydrogen atom or a substituent group; and the substituent groups represented by $R^{101}$ to $R^{116}$ have the same meanings as those of the substituent group represented by $R^1$ in the formula (I) previously described, and preferable embodiments thereof are also the same as described therein. When the substituent groups represented by $R^{101}$ to $R^{116}$ are substitutable groups, each of the groups represented by $R^{101}$ to $R^{116}$ may further have the substituent group represented by $R^1$ in the formula (I) previously described, and when it has two or more substituent groups, the plural substituent groups may be the same or different.

Examples (T-1 to T-139) of substituent groups represented by $R^{101}$ to $R^{116}$ are shown below. However, the invention is not limited thereto.

| | |
|---|---|
| —F | T-1 |
| —Cl | T-2 |
| —Br | T-3 |
| —$CH_3$ | T-4 |
| —$C_4H_9(t)$ | T-5 |
| —$CF_3$ | T-6 |
| —CN | T-7 |
| —$NO_2$ | T-8 |
| —COONa | T-9 |
| —$CONH_2$ | T-10 |
| pyrazolyl | T-11 |
| imidazolyl | T-12 |
| dimethylpyrazolyl | T-13 |
| t-butyl-NHSO₂CH₃-pyrazolyl | T-14 |
| bis(COOC₂H₅)-imidazolyl | T-15 |
| S(CH₂)₂OC₂H₅-triazolyl | T-16 |
| —$OCH_3$ | T-17 |

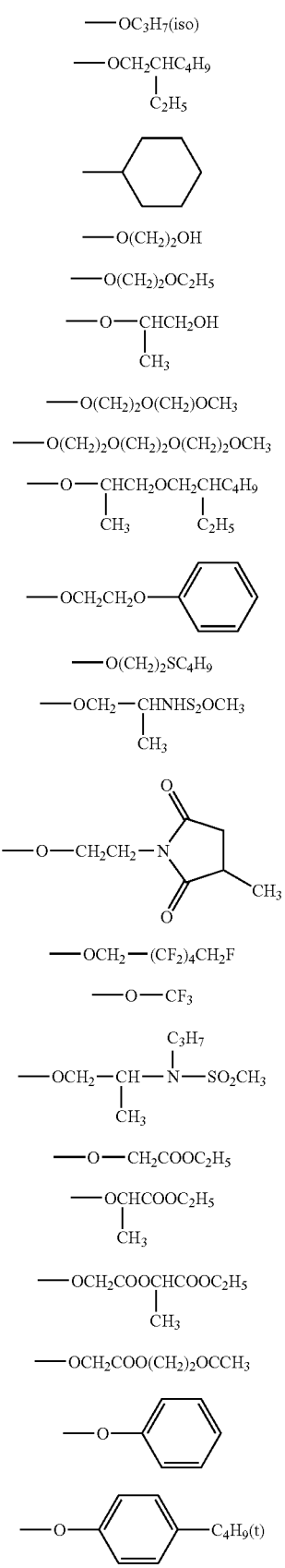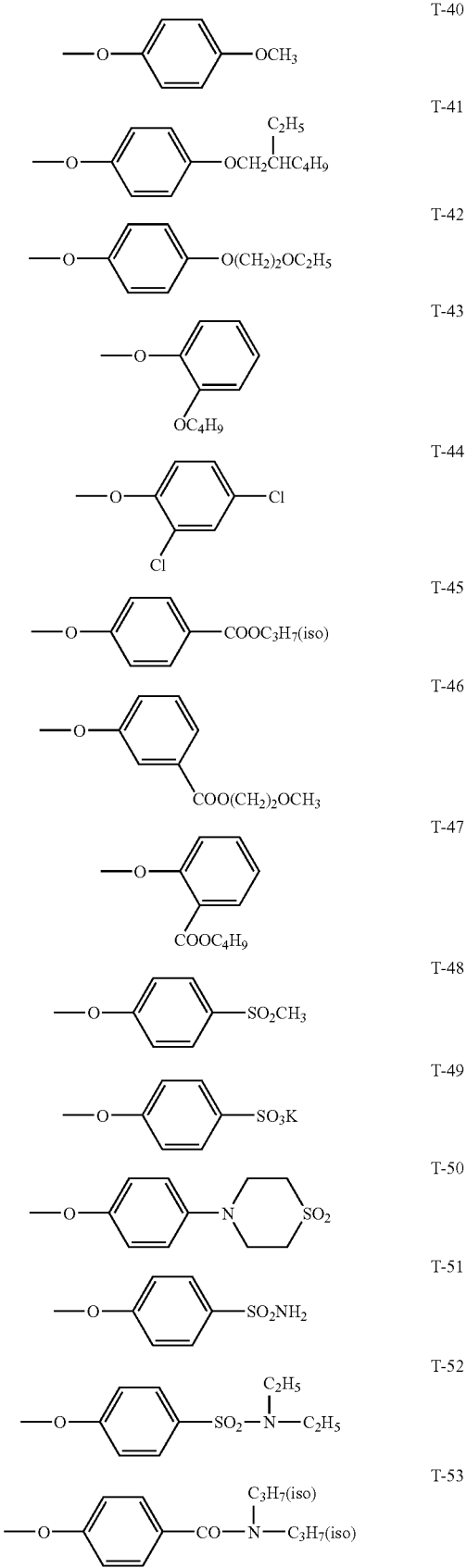

-continued
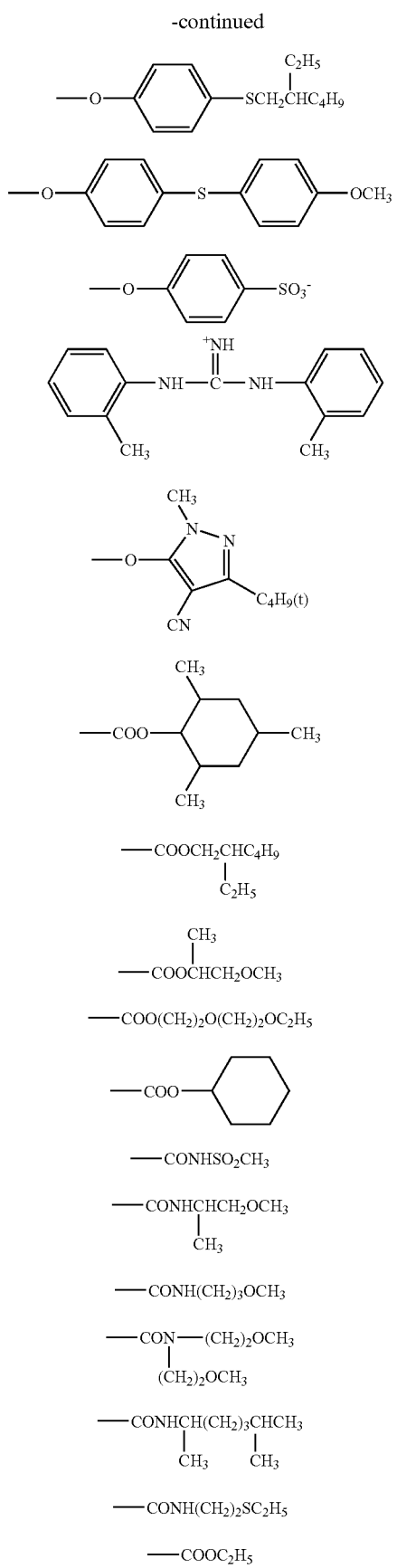
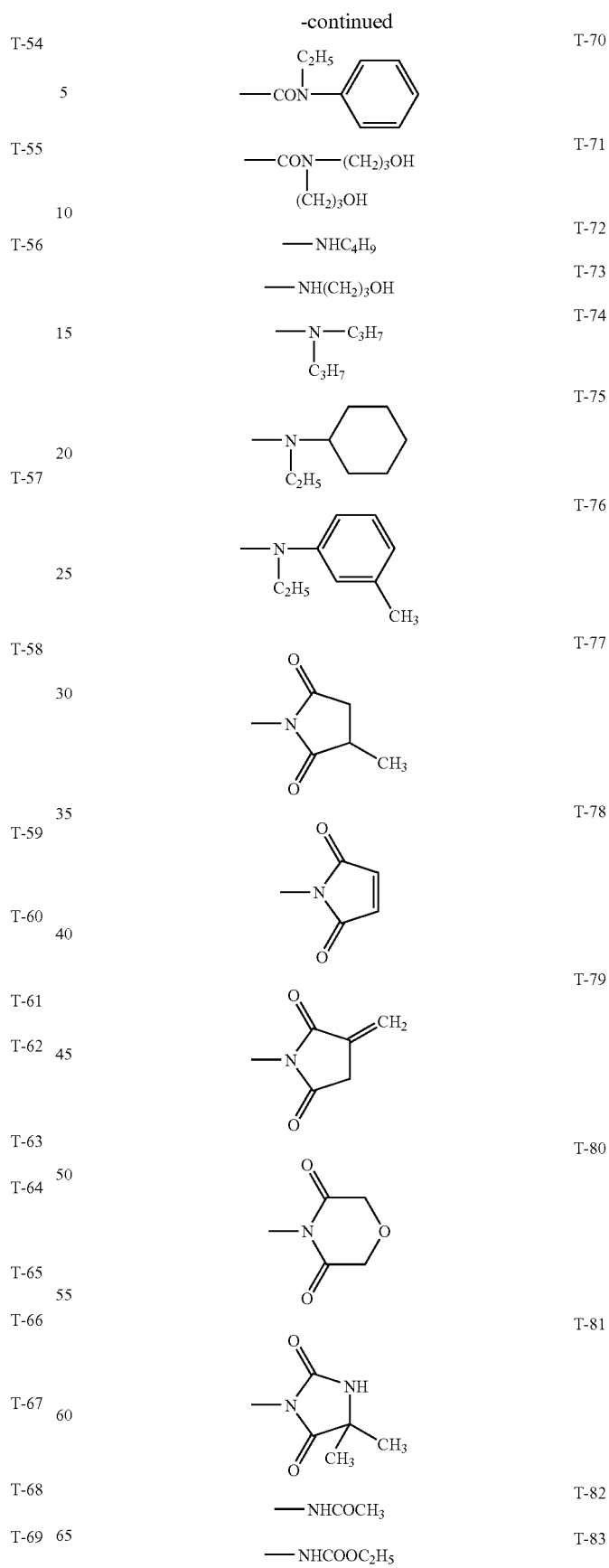

-continued

| | |
|---|---|
| —NHCONC₂H₅<br>       \|<br>       C₂H₅ | T-84 |
| —NHSO₂CH₃ | T-85 |
| —NHSO₂C₄H₉ | T-86 |
| —N—SO₂CH₃<br>  \|<br>  C₄H₉ | T-87 |
| —N—SO₂CH₃<br>  \|<br>  (CH₂)₂O(CH₂)₂OCH₃ | T-88 |
| —N—SO₂—C₆H₁₁ (cyclohexyl)<br>  \|<br>  (CH₂)₂OH | T-89 |
| —N—SO₂—C₆H₅<br>  \|<br>  (CH₂)₂OH | T-90 |
| —SCH₃ | T-91 |
| —S(CH₂)₂SCH₃ | T-92 |
| —S—C₆H₅ | T-93 |
| —S—C₆H₄—N(C₂H₅)₂ (ortho) | T-94 |
| —SOCH₃ | T-95 |
| —SO₂CH₃ | T-96 |
| —SO₂(CH₂)₂O(CH₂)₂OCH₃ | T-97 |
| —SO₂(CH₂)₂OC₂H₅ | T-98 |
| —SO₂(CH₂)₂O(CH₂)₂O(CH₂)₂OCH₃ | T-99 |
| —SO₂(CH₂)₂COOCH₂CHC₄H₉<br>                               \|<br>                               C₂H₅ | T-100 |
| —SO₂—C₆H₁₁ (cyclohexyl) | T-101 |
| —SO₂—CH₂CH₂COOC₂H₅ | T-102 |
| —SO₂CHCOOC₄H₉<br>    \|<br>    CH₃ | T-103 |
| —SO₂CHCOOCHCH₃<br>    \|         \|<br>    C₄H₉    CH₃ | T-104 |
| —SO₂CHCONC₂H₅<br>    \|      \|<br>    C₄H₉   C₂H₅ | T-105 |
| —SO₂CH₂CHCH₂OH<br>           \|<br>           OH | T-106 |
| —SO₂—C₆H₅ | T-107 |
| —SO₂—C₆H₄—CH₃ (para) | T-108 |
| —SO₂—C₆H₄—OCH₃ (para) | T-109 |
| —SO₂—C₆H₄—OC₄H₉ (ortho) | T-110 |
| —SO₂—C₆H₄—COO(CH₂)₂OC₂H₅ (meta) | T-111 |
| —SO₂—C₆H₂(C₃H₇(iso))₃ (2,4,6-triisopropyl) | T-112 |
| —SO₂—C₆H₂Cl₃ (2,4,6-trichloro) | T-113 |
| —SO₂—C₆H₄—COOH (meta) | T-114 |
| —SO₂—C₆H₄—SO₃K (meta) | T-115 |
| —SO₂NHC₂H₅ | T-116 |
| —SO₂NHCH₂CHC₄H₉<br>              \|<br>              C₂H₅ | T-117 |
| —SO₂NHCH(CH₂)₃CHCH₃<br>      \|              \|<br>      CH₃            CH₃ | T-118 |
| —SO₂NH₂ | T-119 |

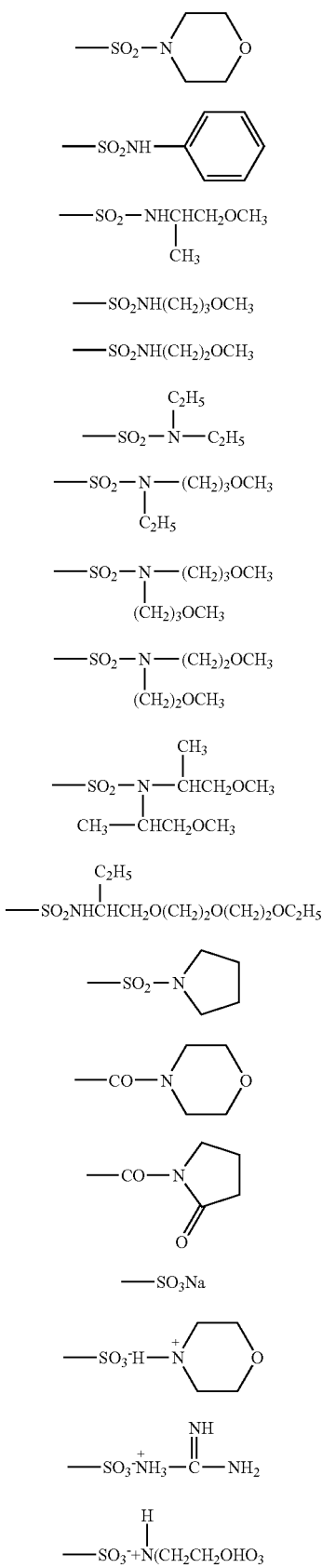

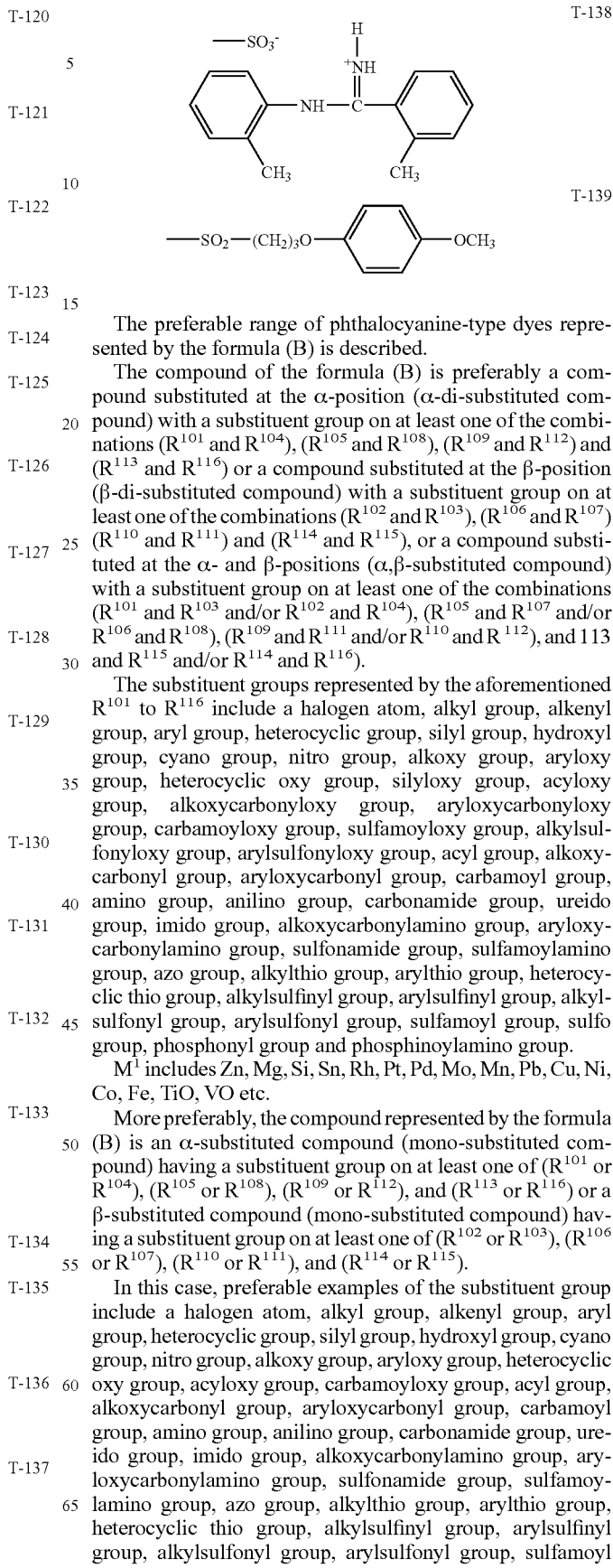

The preferable range of phthalocyanine-type dyes represented by the formula (B) is described.

The compound of the formula (B) is preferably a compound substituted at the α-position (α-di-substituted compound) with a substituent group on at least one of the combinations ($R^{101}$ and $R^{104}$), ($R^{105}$ and $R^{108}$), ($R^{109}$ and $R^{112}$) and ($R^{113}$ and $R^{116}$) or a compound substituted at the β-position (β-di-substituted compound) with a substituent group on at least one of the combinations ($R^{102}$ and $R^{103}$), ($R^{106}$ and $R^{107}$) ($R^{110}$ and $R^{111}$) and ($R^{114}$ and $R^{115}$), or a compound substituted at the α- and β-positions (α,β-substituted compound) with a substituent group on at least one of the combinations ($R^{101}$ and $R^{103}$ and/or $R^{102}$ and $R^{104}$), ($R^{105}$ and $R^{107}$ and/or $R^{106}$ and $R^{108}$), ($R^{109}$ and $R^{111}$ and/or $R^{110}$ and $R^{112}$), and 113 and $R^{115}$ and/or $R^{114}$ and $R^{116}$).

The substituent groups represented by the aforementioned $R^{101}$ to $R^{116}$ include a halogen atom, alkyl group, alkenyl group, aryl group, heterocyclic group, silyl group, hydroxyl group, cyano group, nitro group, alkoxy group, aryloxy group, heterocyclic oxy group, silyloxy group, acyloxy group, alkoxycarbonyloxy group, aryloxycarbonyloxy group, carbamoyloxy group, sulfamoyloxy group, alkylsulfonyloxy group, arylsulfonyloxy group, acyl group, alkoxycarbonyl group, aryloxycarbonyl group, carbamoyl group, amino group, anilino group, carbonamide group, ureido group, imido group, alkoxycarbonylamino group, aryloxycarbonylamino group, sulfonamide group, sulfamoylamino group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group and phosphinoylamino group.

$M^1$ includes Zn, Mg, Si, Sn, Rh, Pt, Pd, Mo, Mn, Pb, Cu, Ni, Co, Fe, TiO, VO etc.

More preferably, the compound represented by the formula (B) is an α-substituted compound (mono-substituted compound) having a substituent group on at least one of ($R^{101}$ or $R^{104}$), ($R^{105}$ or $R^{108}$), ($R^{109}$ or $R^{112}$), and ($R^{113}$ or $R^{116}$) or a β-substituted compound (mono-substituted compound) having a substituent group on at least one of ($R^{102}$ or $R^{103}$), ($R^{106}$ or $R^{107}$), ($R^{110}$ or $R^{111}$), and ($R^{114}$ or $R^{115}$).

In this case, preferable examples of the substituent group include a halogen atom, alkyl group, alkenyl group, aryl group, heterocyclic group, silyl group, hydroxyl group, cyano group, nitro group, alkoxy group, aryloxy group, heterocyclic oxy group, acyloxy group, carbamoyloxy group, acyl group, alkoxycarbonyl group, aryloxycarbonyl group, carbamoyl group, amino group, anilino group, carbonamide group, ureido group, imido group, alkoxycarbonylamino group, aryloxycarbonylamino group, sulfonamide group, sulfamoylamino group, azo group, alkylthio group, arylthio group, heterocyclic thio group, alkylsulfinyl group, arylsulfinyl group, alkylsulfonyl group, arylsulfonyl group, sulfamoyl group, sulfo group and phosphinoylamino group, and preferable examples of $M^1$ include Zn, Pd, Cu, Ni, Co, TiO, VO etc.

More preferably, the compound represented by the formula (B) is an α-substituted compound having a substituent group on at least three of ($R^{101}$ or $R^{104}$), ($R^{105}$ or $R^{108}$), ($R^{109}$ or $R^{112}$), and ($R^{113}$ or $R^{116}$) or a β-substituted compound having a substituent group on at least three of ($R^{102}$ or $R^{103}$), ($R^{106}$ or $R^{107}$), ($R^{110}$ or $R^{111}$), and ($R^{114}$ or $R^{115}$).

In this case, preferable examples of the substituent group include a halogen atom, alkyl group, alkenyl group, aryl group, heterocyclic group, hydroxyl group, cyano group, nitro group, alkoxy group, aryloxy group, heterocyclic oxy group, acyl group, alkoxycarbonyl group, carbamoyl group, amino group, anilino group, carbonamide group, ureido group, imido group, alkoxycarbonylamino group, aryloxycarbonylamino group, sulfonamide group, sulfamoylamino group, azo group, alkylsulfinyl group, arylsulfinyl group, alkylsulfonyl group, arylsulfonyl group, sulfamoyl group and sulfo group, and preferable examples of $M^1$ include Zn, Pd, Cu, Ni, Co, VO etc.

The compound represented by the formula (B) is more preferably an α-substituted compound having the same substituent group on at least three of ($R^{101}$ or $R^{104}$), ($R^{105}$ or $R^{108}$), ($R^{109}$ or $R^{112}$), and ($R^{113}$ or $R^{116}$) or a β-substituted compound having the same substituent group on at least three of ($R^{102}$ or $R^{103}$), ($R^{106}$ or $R^{107}$), ($R^{110}$ or $R^{111}$), and ($R^{114}$ or $R^{115}$), wherein the substituent group is preferably a halogen atom, alkyl group, alkenyl group, aryl group, heterocyclic group, cyano group, alkoxy group, aryloxy group, heterocyclic oxy group, acyl group, alkoxycarbonyl group, carbamoyl group, carbonamide group, ureido group, imido group, sulfonamide group, alkylsulfinyl group, arylsulfinyl group, alkylsulfonyl group, arylsulfonyl group, sulfamoyl group or sulfo group, and $M^1$ is Zn, Pd, Cu, Ni, Co or VO.

The compound represented by the formula (B) is further more preferably an α-substituted compound having a substituent group on at least three of ($R^{101}$ or $R^{104}$), ($R^{105}$ or $R^{108}$), ($R^{109}$ or $R^{112}$), and ($R^{113}$ or $R^{116}$) or a β-substituted compound having a substituent group on at least three of ($R^{102}$ or $R^{103}$), ($R^{106}$ or $R^{107}$), ($R^{110}$ or $R^{111}$), and ($R^{114}$ or $R^{115}$), wherein all the substituent groups are identical with one another, and the substituent group is a halogen atom, alkyl group, heterocyclic group, cyano group, alkoxy group, aryloxy group, heterocyclic oxy group, alkoxycarbonyl group, carbamoyl group, alkylsulfonyl group, arylsulfonyl group, sulfamoyl group or sulfo group, and $M^1$ is Zn, Pd, Cu, Ni, Co VO etc.

The compound represented by the formula (B) is most preferably an α-substituted compound having a substituent group on at least three of ($R^{101}$ or $R^{104}$), ($R^{105}$ or $R^{108}$), ($R^{109}$ or $R^{112}$), and ($R^{113}$ or $R^{116}$) or a β-substituted compound having a substituent group on at least three of ($R^{102}$ or $R^{103}$), ($R^{106}$ or $R^{107}$), ($R^{110}$ or $R^{111}$), and ($R^{114}$ or $R^{115}$), wherein all the substituent groups are identical with one another, and the substituent group is a halogen atom, alkyl group, heterocyclic group, cyano group, alkoxy group, aryloxy group, heterocyclic oxy group, alkoxycarbonyl group, carbamoyl group, alkylsulfonyl group, arylsulfonyl group, sulfamoyl group or sulfo group, and $M^1$ is Zn, Cu, Co VO etc.

Specific examples [Exemplary dyes 1 to -88, Cb-1 to Cb-50, and C1 to c-4] of tetraazaporphyrin-type dyes (including phthalocyanine dyes represented by the formula (B)) represented by the formula (A) are shown below. However, the invention is not limited to these examples.

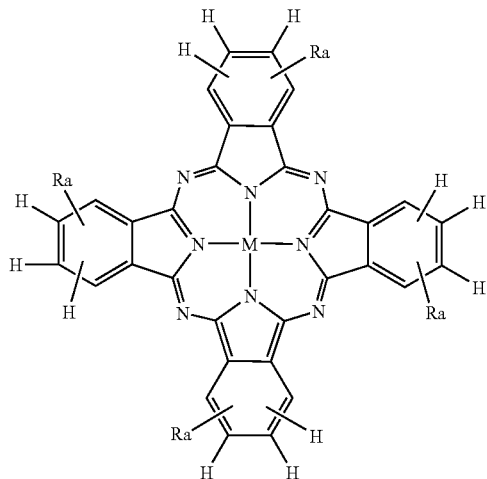

| Exemplary Dye | Ra | M | Exemplary Dye | Ra | M |
| --- | --- | --- | --- | --- | --- |
| C-1 | T-97 | Cu | C-2 | T-98 | Cu |
| C-3 | T-99 | Cu | C-4 | T-100 | Cu |
| C-5 | T-104 | Cu | C-6 | T-105 | Cu |
| C-7 | T-106 | Cu | C-8 | T-110 | Cu |
| C-9 | T-113 | Cu | C-10 | T-118 | Cu |
| C-11 | T-120 | Cu | C-12 | T-122 | Cu |
| C-13 | T-123 | Cu | C-14 | T-126 | Cu |
| C-15 | T-127 | Cu | C-16 | T-129 | Cu |
| C-17 | T-130 | Cu | C-18 | T-24 | Cu |
| C-19 | T-25 | Cu | C-20 | T-31 | Cu |
| C-21 | T-36 | Cu | C-22 | T-41 | Cu |
| C-23 | T-42 | Cu | C-24 | T-50 | Cu |
| C-25 | T-53 | Cu | C-26 | T-61 | Cu |

-continued
| | | | | | |
|---|---|---|---|---|---|
| C-27 | T-66 | Cu | C-28 | T-81 | Cu |
| C-29 | T-88 | Cu | C-30 | T-139 | Cu |
| C-31 | T-97 | Zn | C-32 | T-99 | Zn |
| C-33 | T-24 | Zn | C-34 | T-127 | Zn |
| C-35 | T-130 | Zn | C-36 | T-61 | Zn |
| C-37 | T-97 | Co | C-38 | T-99 | Co |
| C-39 | T-24 | Co | C-40 | T-127 | Co |
| C-41 | T-130 | Co | C-42 | T-61 | Co |
| C-43 | T-99 | VO | C-44 | T-24 | VO |
| C-45 | T-127 | VO | C-46 | T-130 | VO |
| C-47 | T-46 | VO | C-48 | T-52 | VO |
| C-49 | T-99 | Pd | C-50 | T-130 | Pd |
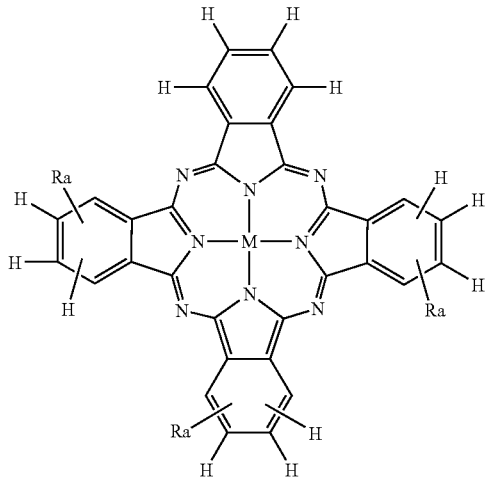
| Exemplary Dye | Ra | M | Exemplary Dye | Ra | M |
|---|---|---|---|---|---|
| C-51 | T-97 | Cu | C-52 | T-99 | Cu |
| C-53 | T-100 | Cu | C-54 | T-88 | Cu |
| C-55 | T-61 | Cu | C-56 | T-66 | Cu |
| C-57 | T-53 | Cu | C-58 | T-50 | Cu |
| C-59 | T-25 | Cu | C-60 | T-130 | Cu |
| C-61 | T-100 | Zn | C-62 | T-130 | Zn |
| C-63 | T-99 | Zn | C-64 | T-130 | Co |
| C-65 | T-99 | Co | C-66 | T-130 | VO |
| C-67 | T-99 | VO | C-68 | T-42 | VO |
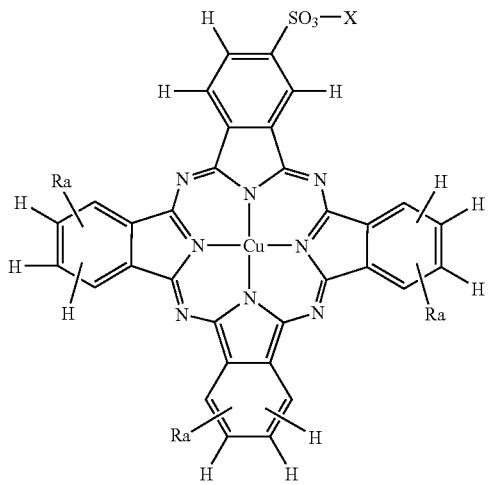
| Exemplary Dye | Ra | X | Exemplary Dye | Ra | X |
|---|---|---|---|---|---|
| C-69 | T-26 | Na | C-70 | T-31 | Na |
| C-71 | T-42 | Na | C-72 | T-60 | Na |
| C-73 | T-65 | Na | C-74 | T-88 | Na |

-continued

| | | | | | |
|---|---|---|---|---|---|
| C-75 | T-92 | Na | C-76 | T-98 | Na |
| C-77 | T-130 | Na | C-78 | T-98 | K |
| C-79 | T-100 | K | C-80 | T-130 | K |
| C-81 | T-123 | H—⁺N(morpholine)H | C-82 | T-124 | H—⁺N(morpholine)H |
| C-83 | T-123 | CH₃—⁺N(pyrrolidine)H | C-84 | T-123 | CH₃—⁺N(pyrrolidine)H |
| C-85 | T-123 | H—⁺N(CH₂CH₂OH)₃ | C-86 | T-123 | H—⁺N(CH₂CH₂OH)₃ |
| C-87 | T-123 | H—⁺C(CH₂CH₂OCH₃)₃ | C-88 | T-123 | H—⁺C(CH₂CH₂OCH₃)₃ |

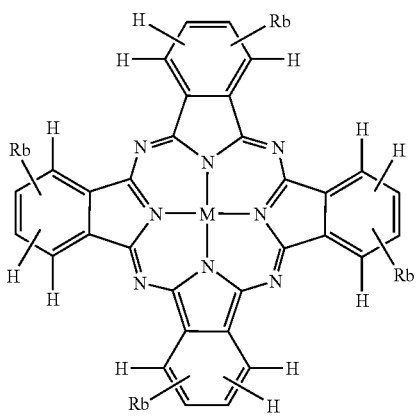

| Exemplary Dye | Rb | M | Exemplary Dye | Rb | M |
|---|---|---|---|---|---|
| Cb-1 | T-97 | Cu | Cb-2 | T-98 | Cu |
| Cb-3 | T-99 | Cu | Cb-4 | T-100 | Cu |
| Cb-5 | T-104 | Cu | Cb-6 | T-105 | Cu |
| Cb-7 | T-106 | Cu | Cb-8 | T-110 | Cu |
| Cb-9 | T-113 | Cu | Cb-10 | T-118 | Cu |
| Cb-11 | T-120 | Cu | Cb-12 | T-122 | Cu |
| Cb-13 | T-123 | Cu | Cb-14 | T-126 | Cu |
| Cb-15 | T-127 | Cu | Cb-16 | T-129 | Cu |
| Cb-17 | T-130 | Cu | Cb-18 | T-24 | Cu |
| Cb-19 | T-25 | Cu | Cb-20 | T-31 | Cu |
| Cb-21 | T-36 | Cu | Cb-22 | T-41 | Cu |
| Cb-23 | T-42 | Cu | Cb-24 | T-50 | Cu |
| Cb-25 | T-53 | Cu | Cb-26 | T-61 | Cu |
| Cb-27 | T-66 | Cu | Cb-28 | T-81 | Cu |
| Cb-29 | T-88 | Cu | Cb-30 | T-139 | Cu |
| Cb-31 | T-97 | Zn | Cb-32 | T-99 | Zn |
| Cb-33 | T-24 | Zn | Cb-34 | T-127 | Zn |
| Cb-35 | T-130 | Zn | Cb-36 | T-61 | Zn |
| Cb-37 | T-97 | Co | Cb-38 | T-99 | Co |
| Cb-39 | T-24 | Co | Cb-40 | T-127 | Co |
| Cb-41 | T-130 | Co | Cb-42 | T-61 | Co |
| Cb-43 | T-99 | VO | Cb-44 | T-24 | VO |
| Cb-45 | T-127 | VO | Cb-46 | T-130 | VO |
| Cb-47 | T-46 | VO | Cb-48 | T-52 | VO |
| Cb-49 | T-99 | Pd | Cb-50 | T-130 | Pd |

-continued
Cc-1
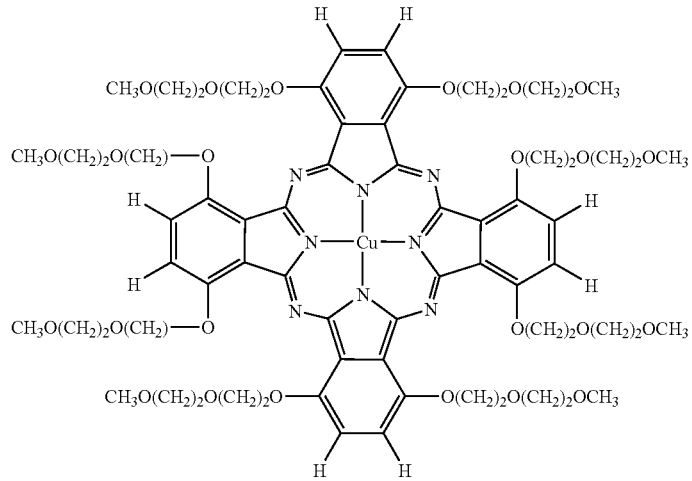
Cc-2
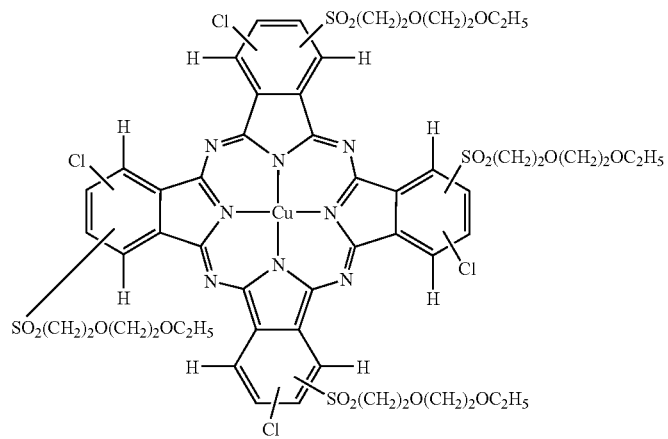
Cc-3
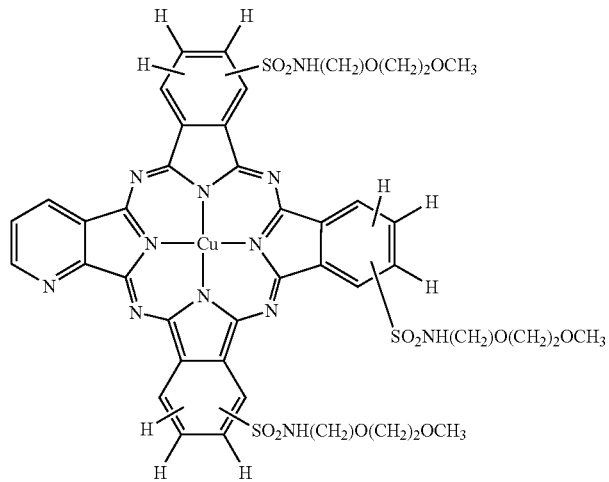

Cc-4
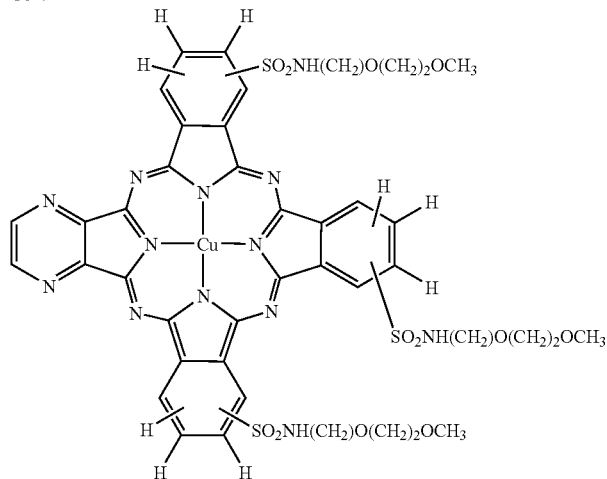
SYNTHESIS EXAMPLE
An example of synthesis of the dye represented by the formula (A) or (B) above is described in more detail by reference to synthesis of Exemplary Dye C-4 as the aforementioned exemplary dye in the following scheme C.
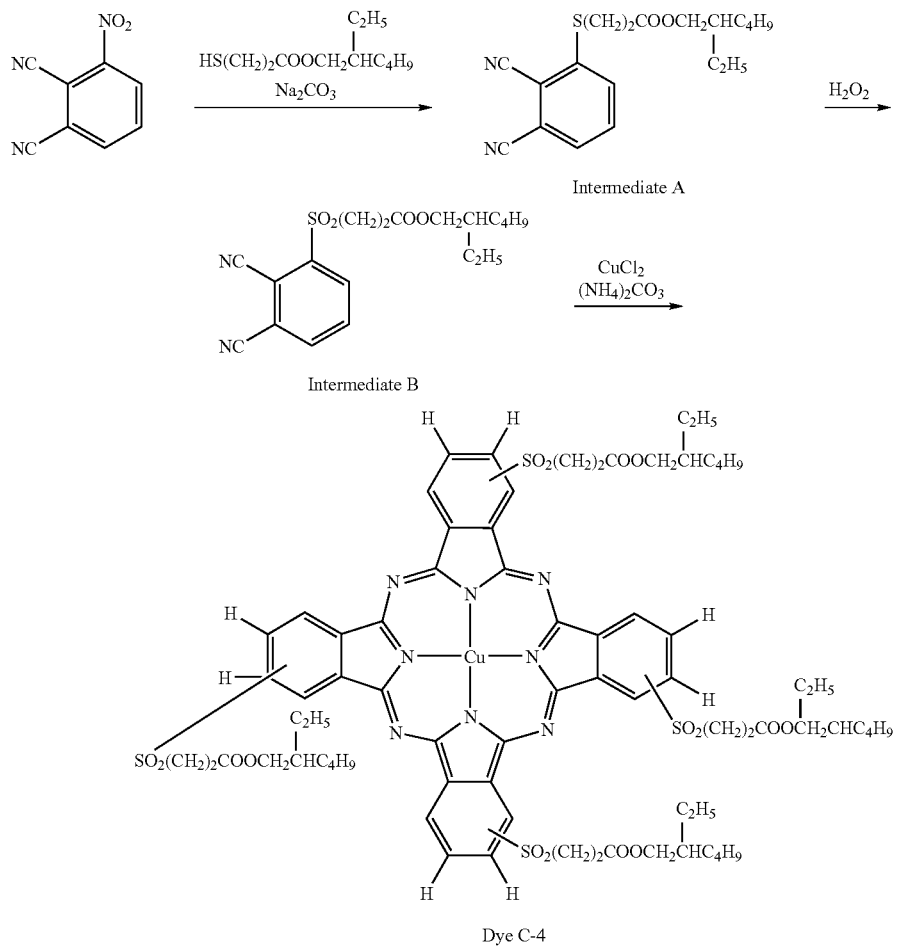

(1) Synthesis of Intermediate 100 ml dimethyl sulfoxide was added to 25.0 g (0.144 mole) of 3-nitrophthalonitrile and 34.7 g (0.159 mole) of 2-ethylhexyl mercaptopropionate, and the mixture was stirred at room temperature. 17.0 g sodium carbonate was added little by little thereto, and after this addition was finished, the mixture was stirred at room temperature for 2 hours to complete the reaction. The resulting reaction solution was poured into 500 ml water and extracted with 300 ml ethyl acetate. Then, the ethyl acetate phase was washed with water and dried over magnesium sulfate anhydride, and the ethyl acetate was distilled away under reduced pressure, whereby oily Intermediate A was quantitatively obtained.

200 ml ethanol and 1 ml acetic acid were added to 50 g (0.144 mole) of Intermediate A obtained above and 1.0 g sodium tungstate, and the mixture was heated under sting. Then, 36.5 g (0.288 mole) aqueous solution of 30% hydrogen peroxide was dropped into it. After dropping was finished, the mixture was heated at 65 to 70° C. for 4 hours under stirring to complete the reaction. After the reaction was finished, the reaction mixture was cooled to room temperature, then 10 g sodium sulfite and 700 ml water were added thereto, and the mixture was stirred at room temperate to precipitate crystals. The crystals were filtered, and washed with water, and recrystallized from 200 ml methanol to give 32.5 g Intermediate B (yield 60%).

(2) Synthesis of Dye C-4

40 ml butanol was added to 7.53 g (0.02 mole) of Intermediate B obtained above and 3.85 g ammonium carbonate, and the mixture was heated at 50° C. under stirring. Then, 0.67 g (0.005 mole) of cupric chloride was added thereto and heated at 100 to 110° C. for 6 hours under stirring. After the reaction was finished, the butanol was distilled away, and the resulting residues were dissolved in chloroform, separated and purified by column chromatography (eluate: chloroform/methanol=10/1) to give 3.3 g of amorphous Dye C-4 (yield 42.0%).

When the maximum absorption wavelength ($\lambda_{max}$) and molar absorption coefficient ($\epsilon$) of the resulting dye in ethyl acetate were measured by a spectrophotometer UV-2400PC (Shimadzu Corporation), the maximum absorption wavelength ($\lambda_{max}$) was 623.4 nm, and the molar absorption coefficient ($\epsilon$) was 47,000.

Other exemplary dyes than Dye C-4 described above can also be synthesized by the same method as described above.

The negative dye-containing curable composition of the invention is constituted by combining one or more dyes represented by the formulae (I) to (III) above, with one or more dyes represented by the formulae (A) to (B) above, and if necessary a known dyes such as xanthene-type dye and a triaryl methane-type dye can further be used.

In a preferable embodiment, one or more azomethine-type dyes represented by the formula (III) are used in combination with one or more phthalocyanine dyes represented by the formula (B).

In the invention, the total concentration of the organic solvent-soluble dye in the negative dye-containing curing composition varies depending on molecular weight and molar absorption coefficient, and is preferably in the range of from 0.5% by mass to 80% by mass, more preferably in the range of from 0.5% by mass to 60% by mass, still more preferably in the range of from 0.5% by mass to 50% by mass, based on the total solid components of the composition.

The ratio of the mass of the azomethine-type dye represented by the formulae (I) to (III) to the tetraazaporphyrin-type dye (including the phthalocyanine dye represented by the formula (B)) represented by the formula (A) (azomethine-type dye/tetraazaporphyrin-type dye [including the phthalocyanine dye]) varies depending on the molecular weight and molar absorption coefficient of each dye, and is preferably in the range of from 1/9 to 9/1, more preferably is in the range of from 1/4 to 4/1, still more preferably is in the range of from 1/4 to 2/1.

(C) Photopolymerization Initiator

Next, the photopolymerization initiator according to the invention will be described. The photopolymerization initiator is contained together with the radical-polymerizable monomer. The oxime-type compound is used as the photopolymerization initiator according to the invention. For example, 2-(o-benzoyloxime)-1-[4-phenylthio)phenyl]-1,2-octanedione and 1-(O-acetyloxime)-1-[9-ethyl-6-(2-methylbenzoyl)-9H-carbazole-3-yl]ethanone are preferred as the oxime-type compound.

Another polymerization initiator can be used in combination with the oxime-type compound. Insofar as the radical-polymerizable monomer can be polymerized, the other polymerization initiator is not particularly limited, but is selected preferably from the viewpoint of properties, the efficiency of initiation, absorption wavelength, availability, cost etc.

Examples of such another photopolymerization initiators include at least one active halogen compound selected from among halomethyl oxadiazole compounds and halomethyl-s-triazine compounds; 3-aryl substituted coumarin compounds; lophine dimers; benzophenone compounds; acetophenone compounds and derivatives thereof; cyclopentadiene-benzene-iron complexes and salts thereof.

Examples of the active halogen compound as the halomethyloxadiazole compound include 2-halomethyl-5-vinyl-1,3,4-oxadiazole compound described in JP-B No. 57-6096, 2-trichloromethyl-5-styryl-1,3,4-oxadiazole,
2-trichloromethyl-5-(p-cyanostyryl)-1,3,4-oxadiazole and 2-trichloromethyl-5-(p-methoxystyryl)-1,3,4-oxadiazole.

Examples of the active halogen compound as the halomethyl-s-triazine compound include a vinylhalomethyl-s-triazine compound described in JP-B No. 59-1281, and a 2-(naphtho-1-yl)-4,6-bishalomethyl-s-triazine compound and a 4-(p-aminophenyl)-2,6-dihalomethyl-s-triazine compound described in JP-A No. 53-133428.

Specific examples thereof include
2,4-bis(trichloromethyl)-6-p-methoxystyryl-s-triazine,
2,6-bis(trichloromethyl)-4-(3,4-methylenedioxyphenyl)-1,3,5-triazine,
2,6-bis(trichloromethyl)-4-(4-methoxyphenyl)-1,3,5-triazine,
2,4-bis(trichloromethyl)-6-(1-p-dimethylaminophenyl-1,3-butadienyl)-s-triazine,
2-trichloromethyl-4-amino-6-p-methoxystyryl-s-triazine,
2-naphtho-1-yl)-4,6-bistrichloromethyl-s-triazine,
2-(4-methoxynaphto-1-yl)-4,6-bistrichloromethyl-s-triazine,
2-(4-ethoxynaphtho-1-yl)-4,6-bistrichloromethyl-s-triazine,
2-(4-butoxynaphtho-1-yl)-4,6-bistrichloromethyl-s-triazine,
2-(4-(2-methoxyethyl)-naphto-1-yl)-4,6-bistrichloromethyl-s-triazine,
2-(4-(2-methoxyethyl)-naphtho-1-yl)-4,6-bistrichloromethyl-s-triazine,
2-(4-(2-butoxyethyl)-naphtho-1-yl)-4,6-bistrichloromethyl-s-triazine,
2-(2-methoxynaphtho-2-yl)-4,6-bistrichloromethyl-s-triazine, 2-(6-methoxy-5-methylnaphtho-2-yl)-4,6-bistrichloromethyl-s-triazine,
2-(6-methoxynaphtho-2-yl)-4,6-bistrichloromethyl-s-triazine,
2-(5-methoxynaphtho-1-yl)-4,6-bistrichloromethyl-s-triazine,
2-(4,7-dimethoxynaphtho-1-yl)-4,6-bistrichloromethyl-s-triazine,
2-(6-ethoxynaphtho-2-yl)-4,6-bistrichloromethyl-s-triazine,
2-(4,5-dimethoxynaphtho-1-yl)-4,6-bistrichloromethyl-s-triazine,
4-(p-N,N-di(ethoxycarbonylmethyl)aminophenyl)-2,6-di(trichloromethyl)-s-triazine,
4-(o-methyl-p-N,N-di(ethoxycarbonylmethyl)aminophenyl)-2,6-di(trichloromethyl)-s-triazine,
4-(p-N,N-di(chloroethyl)aminophenyl)-2,6-di(trichloromethyl)-s-triazine, 4-(o-methyl-p-N,N-di(chloroethyl)aminophenyl)-2,6-di(trichloromethyl)-s-triazine,
4-(p-chloroethylamiophenyl)-2,6-di(trichloromethyl)-s-triazine,
4-(p-N-ethoxycabonylmethylaminophenyl)-2,6-di(trichloromethyl)-s-triazine,
4-(p-N,N-di(phenyl)aminophenyl)-2,6-di(trichloromethyl)-s-triazine,
4-(p-N-chloroethylcarbonylaminophenyl)-2,6-di(trichloromethyl)-s-triazine,
4-(p-N-(p-ethoxyphenyl)caronylaminophenyl)-2,6 di(trichloromethyl)-s-triazine,
4-(m-N,N-di(ethoxycarbonylmethyl)aminophenyl)-2,6-di(trichloromethyl)-s-triazine,
4-(m-bromo-p-N,N-di(ethoxycarbonylmethyl)aminophenyl)-2,6-di(trichloromethyl)-s-triazine,
4-(m-chloro-p-N,N-di(ethoxycarbonylmethyl)aminophenyl)-2,6-di(trichloromethyl)-s-triazine,
4-(m-fluoro-p-N,N-di(ethoxycarbonylmethyl)aminophenyl)-2,6-di(trichloromethyl)-s-triazine,
4-(o-bromo-p-N,N-di(ethoxycarbonylmethyl)aminophenyl)-2,6-di(trichloromethyl)-s-triazine,
4-(o-chloro-p-N,N-di(ethoxycarbonylmethyl)aminophenyl)-2,6-di(trichloromethyl)-s-triazine
4-(fluoro-p-N,N-di(ethoxycarbonylmethyl)aminophenyl-2,6-di(trichloromethyl)-s-triazine,
4-(o-bromo-p-N,N-di(chloroethyl)aminophenyl-2,6-di(trichloromethyl)-s-triazine,
4-(o-chloro-p-N,N-di(chloroethyl)aminophenyl)-2,6-di(trichloromethyl)-s-triazine,
4-(o-fluoro-p-N,N-di(chloroethyl)aminophenyl)-2,6-di(trichloromethyl)-s-triazine,
4-(m-bromo-p-N,N-di(chloroethyl)aminophenyl)-2,6-di(trichloromethyl)-s-triazine,
4-(m-chloro-p-N,N-di(chloroethyl)aminophenyl)-2,6-di(trichloromethyl)-s-triazine,
4-(m-fluoro-N,N-di(chloroethyl)aminophenyl)-2,6-di(trichloromethyl)-s-triazine,
4-(m-bromo-p-N-ethoxycarbonylmethylaminophenyl)-2,6-di(trichloromethyl)-s-triazine,
4-(m-chloro-p-N-ethoxycarbonylmethylaminophenyl)-2,6-di(trichloromethyl)-s-triazine,
4-(m-fluoro-p-N-ethoxycarbonylmethylaminophenyl)-2,6-di(trichloromethyl)-s-triazine,
4-(o-bromo-p-N-ethoxycarbonylmethylaminophenyl)-2,6-di(trichloromethyl)-s-triazine,
4-(o-chloro-p-N-ethoxycarbonylmethylaminophenyl)-2,6-di(trichloromethyl)-s-triazine,
4-(o-fluoro-p-N-ethoxycarbonylmethylaminophenyl)-2,6-di(trichloromethyl)-s-triazine,
4-(m-bromo-p-chloroethylaminophenyl)-2,6-di(trichloromethyl)-s-triazine,
4-(m-chloro-p-chloroethylaminophenyl)-2,6-di(trichloromethyl)-s-triazine,
4-(m-fluoro-p-N-chloroethylaminophenyl)-2,6-di(trichloromethyl)-s-triazine,
4-(o-bromo-p-N-chloroethylaminophenyl)-2,6-di(trichloromethyl)-s-triazine,
4-(o-chloro-p-N-chloroethylaminophenyl)-2,6-di(trichloromethyl)-s-triazine and
4-(o-fluoro-p-N-chloroethylaminophenyl)-2,6-di(trichloromethyl)-s-triazine.

Examples of the other photopolymerization initiators which are usefully used and commercially available include TAZ-series manufactured by Midori Kagaku Co., Ltd. (for example, trade name: TAZ-107, TAZ-110, TAZ-104, TAZ-109, TAZ-140, TAZ-204, TAZ-113 and TAZ-123), T-series manufactured by PANCHIM Co. (for example, trade name: T-OMS, T-BMP, T-R and T-B), Irgacure series manufactured by Ciba Specialties Corp. (for example, trade name: Irgacure 651, Irgacure 184, Irgacure 500, Irgacure 1000, Irgacure 149, Irgacure 819 and Irgacure 261), Darocure series (for example, trade name: Darocure 1173),
4,4'-bis(diethylamino)-benzophenone, ethanone,
2-benzyl-2-dimethylamino-4-morphorinobutylophenone,
2,2-dimethoxy-2-phenylacetophenone,
2-(o-chlorophenyl)-4,5-diphenylimidazolyl dimer, a
2-(o-fluorophenyl)-4,5-diphenylimidazolyl dimer, a
2-(o-methoxyphenyl)-4,5-diphenylimidazolyl dimer, a
2-(p-methoxyphenyl)-4,5-diphenylimidazolyl dimer, a
2-(p-dimethoxyphenyl)-4,5-diphenylimidazolyl dimer, a
2-(2,4-dimethoxyphenyl)-4,5-diphenylimidazolyl dimer, a
2-(p-methylmercaptophenyl)-4,5-diphenylimidazolyl dimer and benzoin isopropyl ether.

Among these various kinds of photopolymerization initiators, oxime-type compounds are preferred. For example, 2-(o-benzoyloxime)-1-[4-(phenylthio)phenyl]-1,2-octanedione and 1-(O-acetyloxime)-1-[9-ethyl-6-(2-methylbenzoyl)-9H-carbazole-3-yl]ethanone are preferred as the photopolymerization initiator.

The photopolymerization initiator may be used in combination with a sensitizer and a photostabilizer.

Examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-ethoxyxanthone, thioxanthone, 2,4-diethylthioxanthone, acridone, 10-butyl-2-chloroacridone, benzyl, dibenzylacetone, p-(dimethylamino)phenyl styryl ketone, p-dimethylamino)phenyl-p-methyl styryl ketone, benzophenone, p-(dimethylamino)benzophenone (or Michler's ketone), p-(diethylamino)benzophenone, benzoanthrone, a benzothiazole compound described in JP-B No. 51-48516, and TINUVIN 1130 and TINUVIN 400.

Other known photopolymerization initiators than such photopolymerization initiators as described above may be used in the negative dye-containing curable composition of the invention.

Specific examples thereof include a vicinal polyketaldonyl compound described in U.S. Pat. No. 2,367,660, α-carbonyl compounds described in U.S. Pat. Nos. 2,367,661 and 2,361,670, an acyloin ether described in U.S. Pat. No. 2,448,828, an aromatic acyloin compound substituted with an α-hydrocarbon described in U.S. Pat. No. 2,722,512, a multinuclear quinone compound described in U.S. Pat. No. 2,951,758, a combination of a triarylimidazole dimer and p-aminophenyl ketone described in U.S. Pat. No. 3,549,367, and a benzothiazole compound and a trihalomethyl-s-triazine compound described in JP-B No. 51-48516.

A total content of the photopolymerization initiator is, based on the total solid content (mass) of the radical-polymerizable monomer, preferably in the range from 0.01% by mass to 50% by mass, more preferably in the range of from 1% by mass to 30% by mass and, particularly preferably in the range of from 1% by mass to 20% by mass. When the content thereof is in the range of from 0.01% by mass to 50% by mass, polymerization is facilitated and film strength can be prevented. Also, when the other photopolymerization initiator is used together with oxyme-type compound, the total content of the oxyme-type compound is, based on the total amount of the photopolymerization initiator, preferably 30% by mass or more, still preferably 50% by mass or more.

(D) Radical-polymerizable Monomer

Next, the radical-polymerizable monomer according to the invention will be described. The radical-polymerizable monomer according to the invention is preferably a compound having at least one addition-polymerizable ethylenic double bond and a boiling point of 100° C. or more under normal pressure. The negative dye-containing curable composition of the invention is constituted such that it has a negative by containing the radical-polymerizable monomer according to the invention, together with a photopolymerization initiator to be described below and the like.

Examples of such radical-polymerizable monomers include monofunctional acrylates or methacrylates such as polyethylene glycol mono(meth)acrylate, polypropylene glycol mono(meth)acrylate, and phenoxyethyl (meth)acrylate; polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanulate; (meth)acrylate compounds prepared after an addition reaction of ethylene oxide or propylene oxide to polyfunctional alcohols such as glycerine and trimethylolethane; urethane acrylates as described in JP-B Nos. 48-41708 and 50-6034, and JP-A No. 51-37193; polyester acrylates as described in JP-A No. 48-64183 and JP-B Nos. 49-43191 and 52-30490; a polyfunctional acrylate or methacrylate such as an epoxyacrylate which is a reaction product of an epoxy resin and (meth)acrylic acid; and mixtures thereof. Examples of the radical-polymerizable monomers further include compounds as described in Nihon Secchaku Kyokaishi (Journal of the Adhesion Society of Japan) Vol. 20, No. 7, pp. 300 to 308 as a photocurable monomer and an oligomer. The radical-polymerizable monomer according to the invention is preferably a multifunctional (meth) acrylate.

A total content of the (D) radical-polymerizable monomer is, based on the total solid content (mass) of the composition of the invention, preferably in the range from 1% by mass to 60% by mass, more preferably in the range of from 10% by mass to 50% by mass. When the content of the radical-polymerizable monomer is in the range from 1% by mass to 60% by mass, the curability of the exposed portion is sufficient and the solubility of the unexposed portion can be improved.

Cross-Linking Agent

According to the invention, it is possible to obtain a film, which has highly been cured by complementally using a cross-linking agent. The cross-linking agent will be described below.

The cross-linking agent capable of being used according to the invention is not particularly restricted, so long as it can cure a film by a cross-linking reaction, and examples of such cross-linking agents include (a) an epoxy resin; (b) a melamine compound, a guanamine compound, a glycoluryl compound or a urea compound substituted with at least one substituent selected from among a methylol group, an alkoxymethyl group and an acyloxymethyl group; and (c) a phenol compound, a naphthol compound or a hydroxyanthrathene compound substituted with at least one substituent selected from among a methylol group, an alkoxymethyl group and an acyloxymethyl group. Among these cross-linking agents, a multifunctional epoxy resin is particularly preferably used as a cross-linking agent according to the invention.

The epoxy resin (a) may be any compound that has an epoxy group and crosslinking property, and examples thereof include a divalent glycidyl group-containing low molecular weight compound, such as bisphenol. A glycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline, a trivalent glycidyl group-containing low molecular weight compound, such as trimethylolpropane triglycidyl ether, trimethylolphenol triglycidyl ether and TrisP-PA (trisphenol P-PA) triglycidyl ether, a tetravalent glycidyl group-containing low molecular weight compound, such as pentaerytritol tetraglycidyl ether and tetramethylolbisphenol A tetraglycidyl ether, a polyvalent glycidyl group-containing low molecular weight compound, such as dipentaerythritol pentaglycidyl ether and dipentaerythritol hexaglycidyl ether, and a glycidyl group-containing polymer compound, such as polyglycidyl (meth)acrylate and a 1,2-epoxy-4-(2-oxiranyl)cyclohexane adduct of 2,2-bis(hydroxymethyl)-1-butanol.

The number of a methylol group, an alkoxymethyl group and an acyloxymethyl group contained in and substituted on the crosslinking agent (b) is generally from 2 to 6 in the case of the melamine compound and from 2 to 4 in the case of the glycoluril compound, the guanamine compound and the urea compound, and is preferably from 5 to 6 in the case of the melamine compound and from 3 to 4 in the case of the glycoluril compound, the guanamine compound and the urea compound.

Hereinafter, such melamine compound, guanamine compound, glycoluryl compound and urea compound as described in (b) may sometimes be referred to also as a methylol group-containing compound of the category (b), an alkoxymethyl group-containing compound of the category (b) or an acyloxymethyl group-containing compound of the category (b).

The methylol group-containing compound of the category (b) can be obtained by heating an alkoxymethyl group-containing compound in an alcohol in the presence of an acid catalyst, such as hydrochloric acid, sulfuric acid, nitric acid and methanesulfonic acid. The acyloxymethyl group-containing compound of the category (b) can be obtained by mixing and stirring a methylol group-containing compound with an acyl chloride in the presence of a basic catalyst.

Specific examples of the compounds of the category (b) having the aforementioned substituent are shown below.

Examples of the melamine compound include hexamethylolmelamine, hexamethoxymethylmelamine, a compound obtained by methoxymethylating from 1 to 5 methylol groups of hexamethylolmelamine or a mixture thereof, hexamethoxyethylmelamine, hexaacyloxymethylmelamine, and a compound obtained by acyloxymethlating from 1 to 5 methylol groups of hexamethylolmelamine or a mixture thereof.

Examples of the guanamine compound include tetramethylolguanamine, tetramethoxymethylguanamine, a compound obtained by methoxymethylating from 1 to 3 methylol groups of tetramethylolguanamine or a mixture thereof, tetramethoxyethylguanamine, tetraacyloxymethylguanamine, and a compound obtained by acyloxymethylating from 1 to 3-methylol groups of tetramethylolguanamine or a mixture thereof.

Examples of the glycoluril compound include tetramethylolglycoluril, tetramethoxymethylglycoluril, a compound obtained by methoxymethylating from 1 to 3 methylol groups of tetramethylolglycoluril or a mixture thereof, and a compound obtained by acyloxymethylating from 1 to 3 methylol groups of tetramethylolglycoluril or a mixture thereof.

Examples of the urea compound include tetramethylolurea, tetramethoxymethylurea, a compound obtained by methoxymethylating from 1 to 3 methylol groups of tetramethylolurea or a mixture thereof, and tetramethoxyethylurea.

The compounds of the category (b) may be used either each individually or in combinations of 2 or more-types.

The cross-linking agent as described in (c), that is, a phenol compound, a naphthol compound or a hydoxyanthracene compound substituted with at least one group selected from a methylol group, an alkoxymethyl group and an acyloxymethyl group can suppress inter-mixing with a overcoat resist by forming cross-links by heating in a same manner as in (b) and further enhance film strength. Hereinafter, such compounds as described above may sometimes be referred to also as a methylol group-containing compound of the category (c), an alkoxymethyl group-containing compound of the category (c) or an acyloxymethyl group-containing compound of the category (c), respectively.

At least two methylol groups, acyloxymethyl groups or alkoxymethyl groups should be contained per one molecule of the crosslinking agent in (c). Compounds in which both the 2-position and 4-position of the phenol compound as a frame compound are substituted are preferable from the viewpoint of cross inking ability by heating and preservation stability. Compounds in which both the ortho-position and para-position relative to the OH group of the naphthol compound or hydroxyanthracene compound as a frame compound are substituted are also preferable. The 3-position or 5-position of the phenol compound may be either substituted or unsubstituted.

Positions except the ortho-position relative to the OH group may be either substituted or unsubstituted in the naphthol compound.

The methylol group-containing compound of the category (c) may be obtained by using a compound having a hydrogen atom at the 2- or 4-position relative to the phenolic OH group as a starting material and, then, allowing the material to react with formalin in the presence of a base catalyst such as sodium hydroxide, potassium hydroxide, ammonia or tetraalkylammonium hydroxide.

The alkoxymethyl group-containing compound of the category (c) may be obtained by heating the methylol group-containing compound of the category (c) in an alcohol in the presence of an acid catalyst such as hydrochloric acid, sulfuric acid, nitric acid or methane sulfonic acid.

The acyloxymethyl group-containing compound of the category (c) may be obtained by allowing the methylol group-containing compound of the category (c) to react with an acyl chloride in the presence of a base catalyst.

Examples of the skeleton compound of the cross-linking agent of the category (c) include a phenol compound, a naphthol compound and a hydroxyanthracene compound, in which the o-positions and the p-positions of the phenolic hydroxyl group are unsubstituted, and examples thereof include phenol, isomers of cresol, 2,3-xylenol, 2,5-xylenol, 3,4-xylenol, 3,5-xylenol, a bisphenol compound, such as bisphenol A, 4,4'-bishydroxybiphenyl, TrisP-PA (produced by Honshu Chemical Industry Co., Ltd.), naphthol, dihydroxynaphthalene and 2,7-dihydroxyanthracene.

As specific examples of the crosslinking agent of the category (c), examples of the phenol compound include trimethylolphenol, tri(methoxymethyl)phenol, a compound obtained by methoxymethylating from 1 to 2 methylol groups of trimethylolphenol, trimethylol-3 cresol, tri(methoxymethyl)-3 cresol, a compound obtained by methoxymethylating from 1 to 2 methylol groups of trimethylol-3 ol, a dimethylolcresol, such as 2,6-dimethylol-4-cresol, tetramethylolbisophenol A, tetramethoxymethylbisphenol A, a compound obtained by methoxymethlating from 1 to 3 methylol groups of tetramethylolbisphenol A, tetramethylol-4,4'-bishydroxybiphenyl, tetramethoxymethyl-4,4'-bishydroxybiphenyl, a hexamethylol compound of TrisP-PA, a hexamethoxymethyl compound of TrisP-PA, a compound obtained by methoxymethylating from 1 to 5 methylol groups of a hexamethylol compound of TrisP-PA, and bishydroxymethylnaphthalenediol.

Examples of the hydroxyanthracene compound include 1,6-dihydroxymethyl-2,7-dihydroxyanthracene, and examples of the acyloxymethyl group-containing compound include compounds obtained by acyloxymethylating a part or all of the methylol groups of the methylol group-containing compounds.

Preferable compounds among the aforementioned compounds are trimethylol phenol, bis hydroxymethyl-p-cresol, tetramethylol bisphenol A, and a hexamethylol form of TrisP-PA (manufactured by Honshu Chemical Industry Co., Ltd.) or a phenol compound in which methylol groups thereof are substituted with alkoxymethyl groups or another phenol compound in which methylol groups thereof are substituted with both methylol groups and alkoxymethyl groups.

The compounds of the category (c) may be used alone or in combinations.

Although an total content of the cross-linking agent to be used in the negative dye-containing curable composition depends on types of starting materials, from the viewpoint of enhancing curability of the coating film, it is, based on the total solid content (mass) of the composition, preferably in the range of from 1% by mass to 70% by mass, more preferably in the range of from 5% by mass to 50% by mass and, particularly preferably in the range of from 7% by mass to 30% by mass.

Thermal Polymerization Inhibitor

A thermal polymerization inhibitor is preferably contained in the dye-containing curable composition of the invention in addition to the aforementioned components. Examples thereof include hydroquinone, p-methoxypehnol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2mercaptobeozimidazole as the thermal polymerization inhibitor.

(E) Organic Solvent

The negative dye-containing curable composition of the invention contains at least one type of organic solvent. The organic solvent is fundamentally not particularly restricted, so long as it satisfies solubility of each component and coating ability of the negative dye-containing curable composition of the invention. The organic solvent is preferably selected by taking into consideration particularly solubility of the dye and binder, coating ability and safety. For example the organic solvent is preferably a cyclic ketone. When the negative dye-containing curable composition of the invention is prepared, the composition preferably contains at least two types of organic solvents.

When a mixed solvent consisting of two or more kinds of organic solvents is used, the mixed solvent is preferably a mixed solvent consisting of a cyclic ketone solvent and another organic solvent. The cyclic ketone solvent includes, for example, cyclopentanone, cyclohexanone and cycloheptanone, among which cyclohexanone is particularly preferable.

Preferred examples of the organic solvent except for the cyclic ketone include an ester compound, such as an alkyl ester, e.g., ethyl acetate, n-butyl acetate, isobutyl acetate, amyl formate, isoamyl acetate, isobutyl acetate, butyl propionate, isopropyl butyrate, ethyl butyrate, butyl butyrate, an alkyl ester compound, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

a 3-oxypropionic acid alkyl ester, such as methyl 3-oxypropionate and ethyl 3-oxypropionate, for example, methyl 3-methoxypropionate, ethyl 3-methoxypropionate, methyl 3-ethoxypropionate and ethyl 3-ethoxypropionate, a 2-oxypropionic acid alkyl ester, such as methyl 2-oxypropionate, ethyl 2-oxypropionate and propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2 methoxy-2-methylpropionate and ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate; an ether compound such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate and propylene glycol monopropyl ether acetate; An aromatic hydrocarbons such as toluene and xylene.

As described above, the other organic solvent used together with the cyclic ketone solvent are preferably ethyl lactate, propylene glycol monomethyl ether acetate, propylene glycol monomethyl ether, propylene glycol monoethyl ether acetate and propylene glycol monopropyl ether acetate, more preferably ethyl lactate, propylene glycol monomethyl ether, and propylene glycol monomethyl ether acetate.

When the cyclic ketone solvent is mixed with another organic solvent, the content of the cyclic ketone solvent is preferably 40% by mass or more, more preferably 60) % by mass or more, based on the total amount of the mixed solvent.

A content of the organic solvent according to the invention is, based on total solid components, preferably in the range of from 5% by mass to 80% by mass, more preferably in the range of from 5% by mass to 60% by mass, still more preferably in the range of from 10% by mass to 50% by mass, from a viewpoint of improving the coating property.

Various Kinds of Additives

In the dye-containing curable composition of the invention, various kinds of additives may be added to the dye-containing curable composition of the invention depending on necessity, such as a filler, a polymer compound other than those described in the foregoing, a surfactant, an adhesion accelerating agent, an antioxidant, an ultraviolet ray absorbing agent and an aggregation preventing agent. Furthermore, a discoloration preventing agent for the dye may also be added depending on necessity.

Examples of the additives include a filler, such as glass and alumina; a polymer compound other than the binder resin, such as polyvinyl alcohol, polyacrylic acid, polyethylene glycol monoalkyl ether and polyfluoroalkyl acrylate; a surfactant, such as a nonionic surfactant, a cationic surfactant and an anionic surfactant; an adhesion accelerating agent, such as vinyltrimethoxysilane, vinyltriethoxysilane, vinyltris(2-methoxyethoxy)silane, N-(2-aminoethyl)-3-aminopropyldimethylmethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; an antioxidant, such as 2,2-thiobis(4 methyl-6-t-butylphenol) and 2,6-di-t-butylphenol; an ultraviolet ray absorbing agent, such as 2-(3-t-butyl-5-methyl-2-hydroxyphenyl)-5-chlorobenzotriazole and alkoxybenzophenone; and an aggregation preventing agent, such as sodium polyacrylate.

In order to accelerate the dissolution of the non-image area to an alkali solution to attain further improvement of the developing property of the dye-containing curable composition of the invention, an organic carboxylic acid, preferably a low molecular weight organic caboxylic acid having a molecular weight of 1,000 or less, may be added to the composition.

Specific examples thereof include an aliphatic monocarboxylic acid, such as formic acid, acetic acid, propionic acid, butyric acid, valeric acid, pivalic acid, caproic acid, diethylacetic acid, enanthic acid and caprylic acid; an aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; an aliphatic tricarboxylic acid, such as ticarballylic acid, aconitic acid and camphoronic acid; an aromatic monocarboxylic acid, such as benzoic acid, toluic acid, cuminic acid, hemellitic acid and mesitylenic acid; an aromatic polycarboxylic acid, such as phthalic acid, isophthalic acid, terephthalic acid, trimellitic acid, trimesic acid, mellophanic acid and pyromellitic acid; and other caboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

Color Filter and Production Method Thereof

The color filter of the invention will be described in detail with reference to the production process thereof the dye-containing curable composition of the invention In the process for producing a color filter of the invention, a color filter can be produced by using the negative dye-containing curable composition of the invention.

The negative dye-containing curable composition is applied onto a substrate by a coating method, such as spin coating, flow coating and roll coating, to form a radiation sensitive composition layer, which is then exposed through a prescribed mask pattern, followed by being developed with a developer, to form a negative colored pattern (image forming step). The process may further contain, depending on necessity, a curing step for curing the thus formed colored pattern by heating and/or exposure. The exposure by the aforementioned stepper exposure is preferred when the negative dye-containing curable composition is exposing.

The color filter comprising desired hues may be produced by repeating the aforementioned image forming steps (and curing step, if necessary) by the number of the hues. As for light or radiation to be used on this occasion, ultraviolet light, particularly, a g ray, an h ray, an i ray or the like is favorably used.

Examples of the substrate include soda glass, PYREX™ (R) glass and quartz glass, which are used in a liquid crystal display device or the like, those having a transparent electroconductive film adhered, and a photoelectric conversion element substrate, such as a silicon substrate, and a complementary metallic oxide semiconductor (CMOS), which are used in a solid state image sensing device or the like. There are some cases where black stripes for separating pixels are formed on the substrate.

An undercoating layer may be provided, depending on necessity, on the substrate for improvement of adhesion to the upper layer, prevention of diffusion of substances, and planarization of the surface of the substrate.

The developer may be any one that has such a formulation that dissolves an uncured part of the dye-containing curable composition of the invention but does not dissolve a cured part thereof. Specific examples thereof include a combination of various kinds of organic solvents and an alkali aqueous solution. Examples of the organic solvent include those having been described for preparation of the dye-containing curable composition of the invention.

Preferred examples of the alkali aqueous solution include alkali aqueous solutions obtained by dissolving such an alkali compound to a concentration of 0.001 to 10% by mass, and preferably from 0.01 to 1% by mass, as sodium hydroxide, potassium hydroxide, sodium carbonate, sodium silicate, sodium metasilicate, aqueous ammonia, ethylamine, diethylamine, dimethylmethanolamine, tetramethylammonium hydroxide, tetraethylammonium hydroxide, choline, pyrrole, piperidine and 1,8-diazabicyclo-(5.4.0)-7-undecene. In the case where a developer containing the alkali aqueous solution is used, the layer thus developed is generally washed with water.

The color filter of the invention can be used in a liquid crystal display (LCD) or a solid state image pickup element such as CCD or CMOS. The color filter is suitable for a high resolution CCD element or CMOS having 1,000,000 or more pixels. The color filter of the invention may be used by being interposed between light receiving portions of the pixels constituting the CCD) and micro-lenses for converging light.

EXAMPLES

While the invention is described in detail with reference to embodiments, the invention is not restricted thereto, so long as it does not depart from the scope and spirit of the invention. Further, all "parts" as used in the examples is given by mass, unless otherwise stated.

Example 1

1) Preparation of the Negative Dye-Containing Curable Composition

Compounds in a composition as described below were mixed and dissolved, to thereby prepare a negative dye-containing curable composition of the invention.

| [Composition] | |
|---|---|
| Ethyl lactate (Organic solvent) | 77.2 g |
| Resin C | 6.4 g |
| (Benzyl methacrylate/methacrylic acid copolymer (=60/40 [molar ratio])) | |
| Monomer A | 5.3 g |
| (radical-polymerizable monomer; DPHA (major component: dipentaerythritol hexaacrylate) manufactured by Nippon Kayaku Co., Ltd.) | |
| Oxime A (Photopolymerization initiator) | 2.3 g |
| The aforementioned exemplary dye C-1 | 6.6 g |
| (Azomethine-type dye represented by formula (I)) | |
| The aforementioned exemplary dye M-1 | 2.2 g |
| (Tetraazaporphyrin-type dye represented by formula (A)) | |

2) Preparation of Glass Substrate Provided with Undercoat Layer

A glass substrate (trade name: Corning 1737, manufactured by Corning, Incorporated) was ultrasonically washed in an aqueous 1% NaOH solution, then washed with water, and dehydration baked (at 200° C. for 30 minutes). Next, A resist solution (trade name: CT-2000; manufactured by Fuji Film Arch Co., Ltd.) was applied on the glass substrate washed with water by using a spin coater such that the resultant film has a thickness of 2 µm. After such application, the glass substrate was dried for one hour at 220° C. to form a cured film (undercoat layer) on the glass substrate.

3) Exposure and Development of Negative Dye-Containing Curable Composition (Image Forming Step)

The negative dye-containing curable composition which had been obtained in 1) was applied on the glass substrate provided with undercoat layer which had been obtained in 2) by using a spin coater such that the resultant film has a thickness of 1 µm and, then, pre-baked for 120 seconds at 100° C.

Examples 2 to 11

Negative dye-containing curable compositions of the examples were prepared in the same way as Example 1, except for the changes in the compositions as shown below in Table 1.

Comparative Example 1

Negative dye-containing curable compositions of the comparative Example 1 was prepared in the same way as Example 1, except for the changes in the compositions as shown below in Table 1.

TABLE 1

|  | Alkali-soluble binder | Radical-polymerizable monomer | Organic solvent-soluble dye | Photopolymerization initiator | Organic solvent |
|---|---|---|---|---|---|
| Example 1 | Resin C (6.4 g) | Monomer A (5.3 g) | C-1/M-1 (6.6 g/2.2 g) | Oxime A (2.3 g) | ethyl lactate (77.2 g) |
| Example 2 | Resin C (6.4 g) | Monomer A (5.3 g) | C-1/M-1 (6.6 g/2.2 g) | Oxime A (2.3 g) | cyclohexanone (77.2 g) |
| Example 3 | Resin A (6.4 g) | Monomer A (5.3 g) | C-1/M-1 (6.6 g/2.2 g) | Oxime A (2.3 g) | cyclohexanone (77.2 g) |
| Example 4 | Resin B (6.4 g) | Monomer A (5.3 g) | C-1/M-1 (6.6 g/2.2 g) | Oxime A (2.3 g) | cyclohexanone (77.2 g) |
| Example 5 | Resin C (6.4 g) | Monomer A (5.3 g) | C-1/M-76 (6.6 g/2.2 g) | Oxime A (2.3 g) | cyclohexanone (77.2 g) |
| Example 6 | Resin A (6.4 g) | Monomer A (5.3 g) | C-1/M-76 (6.6 g/2.2 g) | Oxime A (2.3 g) | cyclohexanone (77.2 g) |
| Example 7 | Resin B (6.4 g) | Monomer A (5.3 g) | C-1/M-76 (6.6 g/2.2 g) | Oxime A (2.3 g) | cyclohexanone (77.2 g) |
| Example 8 | Resin C (6.4 g) | Monomer A (5.3 g) | VB-2620/M-76 (6.6 g/2.2 g) | Oxime A (2.3 g) | cyclohexanone (77.2 g) |
| Example 9 | Resin A (6.4 g) | Monomer A (5.3 g) | VB-2620/M-76 (6.6 g/2.2 g) | Oxime A (2.3 g) | cyclohexanone (77.2 g) |
| Example 10 | Resin B (6.4 g) | Monomer A (5.3 g) | VB-2620/M-76 (6.6 g/2.2 g) | Oxime A (2.3 g) | cyclohexanone (77.2 g) |
| Example 11 | Resin C (6.4 g) | Monomer A (5.3 g) | VB-2620/M-1 (6.6 g/2.2 g) | Oxime A (2.3 g) | cyclohexanone (77.2 g) |
| Comparative Example 1 | Resin C (6.4 g) | Monomer A (5.3 g) | C.I. Solvent Blue 67/C.I. Acid Blue 83 (6.6 g/2.2 g) | TAZ-107 (2.3 g) | ethyl lactate (77.2 g) |

* Alkali-soluble resin
Resin A: ACA250 (trade name) manufactured by Daicel Chemical Industries, Ltd. (Chemical name: 4-Acryloyloxymethyl-2-hydroxycyclohexyl methacrylate/alkyl methacrylate copolymer)
Resin B: ACA300 (trade name) manufactured by Daicel Chemical Industries, Ltd. (Chemical name: 4-Acryloyloxymethyl-2-hydroxycyclohexyl methacrylate/alkyl methacrylate copolymer)
Resin C: Benzyl methacrylate/methacrylic acid copolymer (=60/40 [molar ratio])
* Radical-polymerizable monomer
Monomer A: DPHA (major component: dipentaerythritol hexaacrylate) manufactured by Nippon Kayaku Co., Ltd.
* Organic solvent-soluble dye
In the table 1, symbols (excluding VB-2620) in the column "Organic solvent-soluble dye" correspond to exemplary dye numbers of exemplary dyes of the azomethine-type dye represented by the formula (I) and the tetraazaporphyrin-type dye represented by the formula (A). VB-2620 is a tetraazaporphyrin-type dye represented by the formula (A), manufactured by Orient Chemical Industries, Ltd.
* Photopolymerization initiators
TAZ-107 manufactured by Midori Kagaku Co., Ltd.
Oxime A: 2-(O-benzoyloxime)-1-[4-(phenylthio)phenyl]-1,2-octane dione manufactured by Ciba Specialty Chemicals 4) Evaluation (1) Sensitivity To the samples formed in the examples and comparative examples, light having a wavelength of 365 nm was irradiated on the film by using an i-ray stepper exposure device and changing the exposure amount, to thereby perform a height 2 μm×width 2 μm pattern exposure. After the exposure, the film was developed for 60 seconds at 23° C. by using a developer (trade name; CD-2000; 60%; manufactured by Fuji Film Arch Co., Ltd.). Subsequently, the glass substrate was rinsed with running water for 20 seconds, subjected to spray drying, to thereby obtain a pattern image A on the wafer. Thereafter, the wafer was heated for 10 minutes at 200° C., to thereby obtain a final image B (color filter).

In this case, the appropriate exposure amount is the exposing amount such that the ratio of a pixel pattern of height 2 μm×width 2 μm to that of the spacing between the pattern is 1:1. This exposure amount is taken as the sensitivity. A low value, indicating a high sensitivity, is preferable. The results are shown in the Table 2 below.

(2) Profile of Pattern

In (1) above, for a pixel pattern, formed with an appropriate exposure amount, an SEM image of a cross section was examined. Here, the evaluation of a good rectangular profile was designated "A", a slightly round top contour was evaluated as "B", and a completely rounded top profile (round head) as "C". The results are shown in Table 2 below.

(3) Residues in a Unexposed Portion

With respect to the pixel pattern formed by suitable light exposure in the above item (1), a section of the pattern on an SEM image was observed. In evaluation, "A" was given when no residues were recognized on the unexposed portion, "B" was given when residues were slightly recognized on the unexposed portion but were practically not problematic, and "C" was given when residues was given when residues were evidently recognized on the unexposed portion. The results are shown in Table 2 below.

(4) Heat Resistance

The negative dye-containing curable composition obtained in the above item 1) was applied to a thickness of 1 μm on a separately prepared glass substrate. The glass substrate on which the coating had been formed was left for 1 hour on a hot plate at 200° C. and then measured for its spectrometric change by using a spectophotometer (trade name: MS-1500, manufactured by Shimadzu Corporation). From the measurement value, ΔE'ab was calculated by a color analysis program, to evaluate heat resistance. The results are shown in Table 2 below.

(5) Light Fastness

The negative dye-containing curable composition obtained in the above item 1) was applied to a thickness of 1 μm on a separately prepared glass substrate, and the resulting coating was irradiated by an xenon irradiation weather meter (trade name: SX75 manufactured by Suga Test Instrument Co., Ltd.) for 20 hours and then measured for its spectrometric change by using a spectophotometer (trade name: MS-1500, manufactured by Shimadzu Corporation). From the measurement value, ΔE'ab was calculated by a color analysis program, to evaluate heat resistance [sic]. The results are shown in Table 2 below.

TABLE 2

| | Sensitivity (mJ/cm$^2$) | Profile | Residues in unexposed portion | Heat resistance | Light fastness |
|---|---|---|---|---|---|
| Example 1 | 650 | B | B | 4.9 | 4.9 |
| Example 2 | 600 | B | A | 5.1 | 5.1 |
| Example 3 | 300 | A | A | 5.0 | 3.8 |
| Example 4 | 350 | A | A | 4.8 | 4.1 |
| Example 5 | 650 | B | A | 5.2 | 3.7 |
| Example 6 | 300 | A | A | 4.9 | 4.2 |
| Example 7 | 350 | A | A | 5.1 | 3.9 |
| Example 8 | 650 | B | A | 5.0 | 4.1 |
| Example 9 | 350 | A | A | 5.2 | 3.8 |
| Example 10 | 300 | A | A | 4.8 | 3.8 |
| Example 11 | 600 | B | A | 4.8 | 3.9 |
| Comparative Example 1 | 2000 | C | C | 38.2 | 44.5 |

As can be seen from Table 2, the Examples using the azomethine-type dye represented by the formula (I) and the tetraazaporphyrin-type dye represented by the formula (A) were excellent in heat resistance and light fastness, excellent in sensitivity and superior in pattern rectangularity with no residues recognized in the unexposed portion. On the other hand, the Comparative Example using a dye other than the dye according to the invention was significantly inferior in beat resistance and light fastness and poor in both sensitivity and pattern rectangularity with resides recognized in the unexposed portion.

According to the invention, there can be provided a negative dye-containing curable composition capable of forming a rectangular pattern (particularly at the time of formation of a pattern by stepper light exposure) and excellent in heat fastness and light fastness without residues in a unexposed portion. According to the invention, there can also be provided a color filter excellent in color formability with high cost performance, as well as a method of producing the same.

What is claimed is:

1. A negative dye-containing curable composition comprising at least (A) an alkali-soluble binder, (B) an organic solvent-soluble dye, (C) a photopolymerization initiator, (D) a radical-polymerizable monomer and (E) an organic solvent,
   wherein the organic solvent soluble dye (B) comprises at least one kind of azomethine-type dye represented by the following formula (I) and at least one kind of tetraazaporphyrin-type dye represented by the following formula (A), and the photopolymerization initiator (C) is an oxime-type compound,

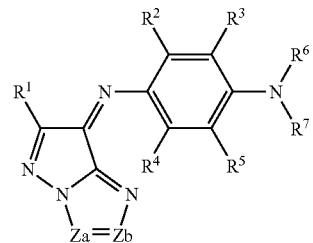

Formula (I)

wherein $R^1$ represents a hydrogen atom or a substituent group; $R^2$, $R^3$, $R^4$ and $R^5$ each independently represent a hydrogen atom or a substituent group; $R^6$ and $R^7$ each independently represent an alkyl group, alkenyl group, aryl group or heterocyclic group; Za and Zb each independently represent —N= or —C($R^8$)=; $R^8$ represents a hydrogen atom, alkyl group, aryl group or heterocyclic group; and $R^2$ and $R^3$, $R^3$ and $R^6$, $R^4$ and $R^5$, $R^5$ and $R^7$, or $R^6$ and $R^7$ each independently may be bonded to each other to form a 5- to 7-membered ring,

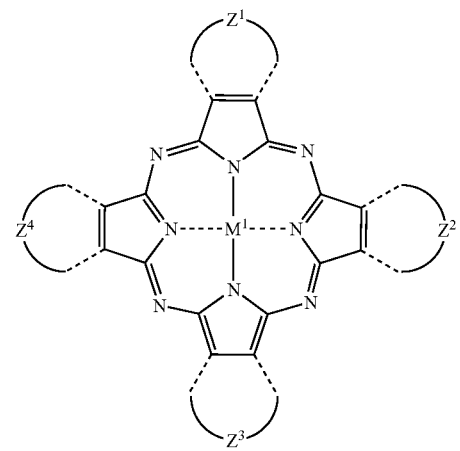

Formula (A)

wherein $M^1$ represents a metal, and $Z^1$, $Z^2$, $Z^3$ and $Z^4$ each independently represent an atomic group forming a 6-membered ring composed of atoms selected from a carbon atom and a nitrogen atom.

2. The negative dye-containing curable composition according to claim 1, wherein the azomethine-type dye represented by the formula (I) is an azomethine-type dye represented by the following formula (II):

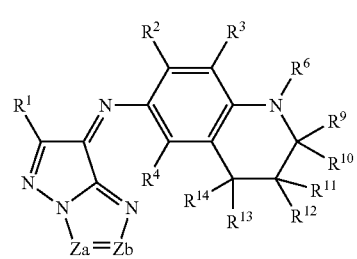

Formula (II)

wherein $R^1$ represents a hydrogen atom or a substituent group; $R^2$, $R^3$ and $R^4$ each independently represent a hydrogen atom or a substituent group; $R^6$ represents an alkyl group, alkenyl group, aryl group or heterocyclic group; $R^9$, $R^{10}$, $R^{11}$, $R^{12}$, $R^{13}$ and $R^{14}$ each independently represent a hydrogen atom or a substituent group; Za and Zb each independently represent —N═ or —C($R^8$)═; $R^8$ represents a hydrogen atom, alkyl group, aryl group or heterocyclic group; and $R^2$ and $R^3$, $R^3$ and $R^6$, $R^6$ and $R^9$, or $R^4$ and $R^{14}$ each independently may be bonded to each other to form a 5- to 7-membered ring.

3. The negative dye-containing curable composition according to claim 1, wherein the azomethine-type represented by the formula (I) is an azomethine-type dye represented by the following formula (III):

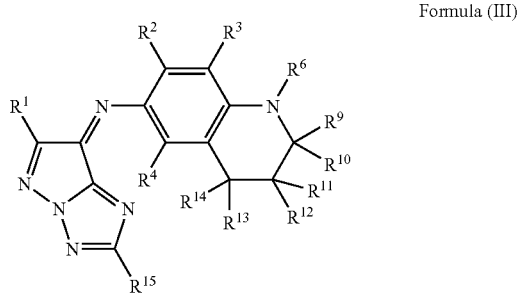

Formula (III)

wherein $R^1$ represents a hydrogen atom or a substituent group; $R^2$, $R^3$ and $R^4$ each independently represent a hydrogen atom or a substituent group; $R^6$ represents an alkyl group, alkenyl group, aryl group or heterocyclic group; $R^9$, $R^{10}$, $R^{11}$, $R^{12}$, $R^{13}$ and $R^{14}$ each independently represent a hydrogen atom or a substituent group; $R^{15}$ represents a hydrogen atom, alkyl group, aryl group or heterocyclic group; and $R^2$ and $R^3$, $R^3$ and $R^6$, $R^6$ and $R^9$, or $R^4$ and $R^{14}$ each independently may be bonded to each other to form a 5- to 7-membered ring.

4. The negative dye-containing curable composition according to claim 1, wherein the tetraazaporphyrin-type dye represented by the formula (A) is a phthalocyanine dye represented by the following formula (B):

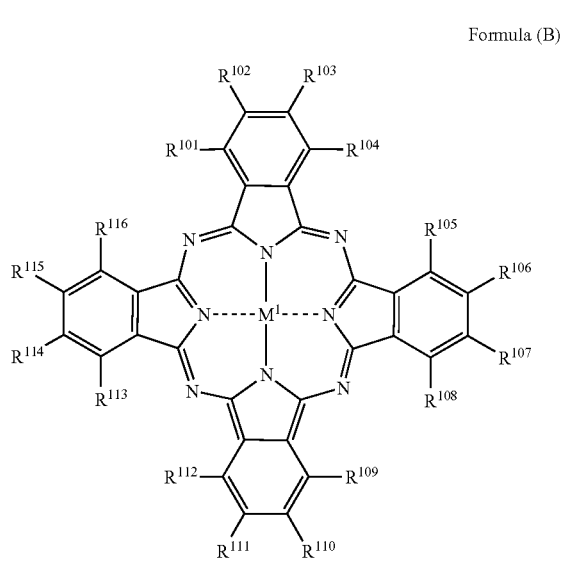

Formula (B)

wherein $M^1$ represents a metal; and $R^{101}$ to $R^{116}$ each independently represent a hydrogen atom or a substituent group.

5. The negative dye-containing curable composition according to claim 1, wherein a ratio of a mass of the azomethine-type dye represented by the formula (I) to a mass of the tetraazaporphyrin-type dye represented by the formula (A) (azomethine-type dye/tetraazaporphyrin-type dye) is in the range of from 1/9 to 9/1.

6. The negative dye-containing curable composition according to claim 1, wherein the total concentration of (B) the organic solvent-soluble dye is in the range of from 0.5% by mass to 80% by mass based on the total solid components.

7. The negative dye-containing curable composition according to claim 1, wherein (A) the alkali-soluble binder is a resin having an unsaturated double bond in a side chain thereof.

8. The negative dye-containing curable composition according to claim 1, wherein (E) the organic solvent comprises a cyclic ketone solvent.

9. The negative dye-containing curable composition according to claim 1, wherein the oxime-type compound is selected from
2-(O-benzoyloxime)-1-[4-(phenylthio)phenyl]-1,2-octane dione and
1-(O-acetyloxime)-1-[9-ethyl-6-(2-methylbenzoyl)-9H-carbazol-3-yl]ethanone.

10. A color filter, produced by using a negative dye-containing curable composition comprising at least (A) an alkali-soluble binder, (B) an organic solvent-soluble dye, (C) a photopolymerization initiator, (D) a radical-polymerizable monomer and (E) an organic solvent, wherein the organic solvent-soluble dye (B) comprises at least one kind of azomethine-type dye represented by the following formula (I) and at least one kind of tetraazaporphyrin-type dye represented by the following formula (A), and the photopolymerization initiator (C) is an oxime-type compound,

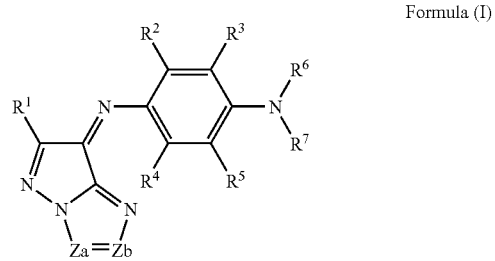

Formula (I)

wherein $R^1$ represents a hydrogen atom or a substituent group; $R^2$, $R^3$, $R^4$ and $R^5$ each independently represent a hydrogen atom or a substituent group; $R^6$ and $R^7$ each independently represent an alkyl group, alkenyl group, aryl group or heterocyclic group; Za and Zb each independently represent —N═ or —C($R^8$)═; $R^8$ represents a hydrogen atom, alkyl group, aryl group or heterocyclic group; and $R^2$ and $R^3$, $R^3$ and $R^6$, $R^4$ and $R^5$, $R^5$ and $R^7$, or $R^6$ and $R^7$ each independently may be bonded to each other to form a 5- to 7-membered ring, Formula (A)

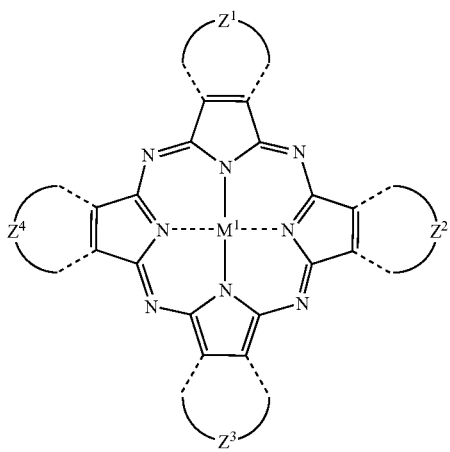

wherein M¹ represents a metal, and $Z^1$, $Z^2$, $Z^3$ and $Z^4$ each independently represent an atomic group forming a 6-membered ring composed of atoms selected from a carbon atom and a nitrogen atom.

11. The color filter according to claim 10, wherein the azomethine-type dye represented by the formula (I) is an azomethine-type dye represented by the following formula (II):

Formula (II)

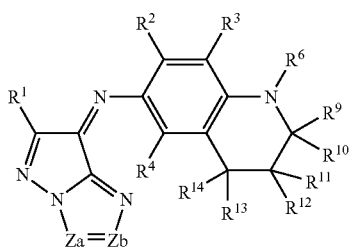

wherein $R^1$ represents a hydrogen atom or a substituent group; $R^2$, $R^3$ and $R^4$ each independently represent a hydrogen atom or a substituent group; $R^6$ represents an alkyl group, alkenyl group, aryl group or heterocyclic group; $R^9$, $R^{10}$, $R^{11}$, $R^{12}$, $R^{13}$ and $R^{14}$ each independently represent a hydrogen atom or a substituent group; Za and Zb each independently represent —N= or —C($R^8$)=; $R^8$ represents a hydrogen atom, alkyl group, aryl group or heterocyclic group; and $R^2$ and $R^3$, $R^3$ and $R^6$, $R^6$ and $R^9$, or $R^4$ and $R^{14}$ each independently may be bonded to each other to form a 5- to 7-membered ring.

12. The color filter according to claim 10, wherein the azomethine-type dye represented by the formula (I) is an azomethine-type dye represented by the following formula (III):

Formula (III)

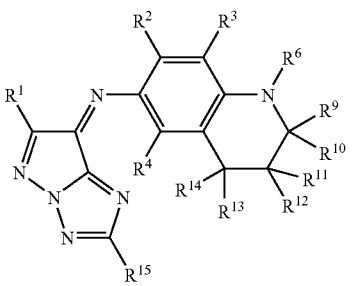

wherein $R^1$ represents a hydrogen atom or a substituent group; $R^2$, $R^3$ and $R^4$ each independently represent a hydrogen atom or a substituent group; $R^6$ represents an alkyl group, alkenyl group, aryl group or heterocyclic group; $R^9$, $R^{10}$, $R^{11}$, $R^{12}$, $R^{13}$ and $R^{14}$ each independently represent a hydrogen atom or a substituent group; $R^{15}$ represents a hydrogen atom alkyl group, aryl group or heterocyclic group; and $R^2$ and $R^3$, $R^3$ and $R^6$, $R^6$ and $R^9$, or $R^4$ and $R^{14}$ each independently may be bonded to each other to form a 5- to 7-membered ring.

13. The color filter according to claim 10, wherein the tetraazaporphyrin-type dye represented by the formula (A) is a phthalocyanine dye represented by the following formula (B):

Formula (B)

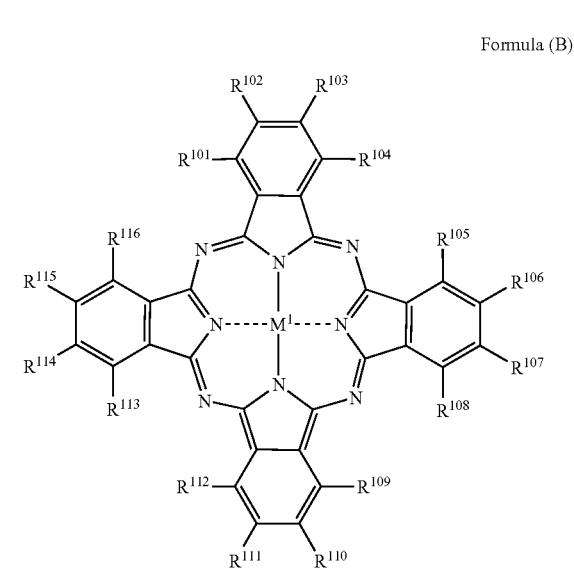

wherein M¹ represents a metal; and $R^{101}$ to $R^{116}$ each independently represent a hydrogen atom or a substituent group.

14. The color filter according to claim 10, wherein a ratio of a mass of the azomethine-type dye represented by the formula (I) to a mass of the tetraazaporphyrin-type dye represented by the formula (A) (azomethine-type dye/tetraazaporphyrin-type dye) is in the range of from 1/9 to 9/1.

15. The color filter according to claim 10, wherein the total concentration of (B) the organic solvent soluble dye is in the range of from 0.5% by mass to 80% by mass based on the total solid components.

16. The color filter according to claim 10, wherein (A) the alkali-soluble binder is a resin having an unsaturated double bond in a side chain thereof.

17. The color filter according to claim 10, wherein (E) the organic solvent comprises a cyclic ketone solvent.

18. The color filter according to claim 10, wherein the oxime-type compound is selected from 2-(O-benzoyloxime)-1-[4-phenylthio)phenyl]-1,2-octane dione and 1-(O-acetyloxime)-1-[9-ethyl-6-(2-methylbenzoyl)-9H-carbazol-3-yl] ethanone.

19. A method of producing a color filter comprising applying the negative dye-containing cable composition according to claim 1 onto a substrate, exposing the applied negative dye-containing curable composition through a mask; and developing the exposed negative dye-containing curable composition to form a pattern.

* * * * *